United States Patent
Templeman et al.

(10) Patent No.: US 8,993,042 B2
(45) Date of Patent: Mar. 31, 2015

(54) METHOD FOR DETERMINING THE PRODUCTION PARAMETERS FOR A SUBSTRATE COATING PROCESS

(75) Inventors: Cynthia Gazepis Templeman, Ypsilanti, MI (US); Alec B. Scranton, Coralville, IA (US); Beth Ann Ficek, Bartlett, IL (US); Cynthia Hoppe, Amana, IA (US)

(73) Assignees: Toyota Motor Engineering & Manufacturing North America, Inc., Erlanger, KY (US); University of Iowa Research Foundation, Iowa City, IA (US)

( * ) Notice: Subject to any disclaimer, the term of this patent is extended or adjusted under 35 U.S.C. 154(b) by 919 days.

(21) Appl. No.: 12/683,001

(22) Filed: Jan. 6, 2010

(65) Prior Publication Data

US 2011/0166687 A1 Jul. 7, 2011

(51) Int. Cl.
| | | |
|---|---|---|
| G05G 13/00 | (2006.01) | |
| G03F 7/038 | (2006.01) | |
| C08G 59/24 | (2006.01) | |
| C08G 59/68 | (2006.01) | |
| C09D 4/00 | (2006.01) | |

(52) U.S. Cl.
CPC ............... *G03F 7/038* (2013.01); *C08G 59/24* (2013.01); *C08G 59/68* (2013.01); *C08G 59/683* (2013.01); *C09D 4/00* (2013.01); *C08L 2312/06* (2013.01)
USPC ............................................. 427/8; 700/104

(58) Field of Classification Search
CPC .................................. G05B 13/00; G06F 19/00
USPC ....................... 427/508, 514, 517, 8; 700/104
See application file for complete search history.

(56) References Cited

U.S. PATENT DOCUMENTS

| | | | |
|---|---|---|---|
| 5,182,056 A | 1/1993 | Spence et al. | |
| 5,789,039 A | 8/1998 | Biller et al. | |
| 6,022,733 A * | 2/2000 | Tam et al. | 435/287.1 |
| 6,306,555 B1 * | 10/2001 | Schulz et al. | 430/270.1 |
| 6,490,501 B1 | 12/2002 | Saunders | |
| 6,544,334 B1 | 4/2003 | Potyrailo et al. | |
| 6,833,154 B2 | 12/2004 | Okamitsu | |
| 2004/0148051 A1 | 7/2004 | Straus | |
| 2005/0089795 A1 | 4/2005 | Cole et al. | |

(Continued)

OTHER PUBLICATIONS

International Search Report and Written Opinion issued on Mar. 16, 2011 in corresponding International Application No. PCT/US11/20372 filed on Jan. 6, 2011.

(Continued)

*Primary Examiner* — Elena T Lightfoot
(74) *Attorney, Agent, or Firm* — Oblon, McClelland, Maier & Neustadt, L.L.P.

(57) ABSTRACT

A method to evaluate, determine and optimize production parameters for a coating application of a UV cationic polymerizable coating system to a substrate is provided. The method is based on a simulation model which includes both shadow and dark cure processes. Both of an active center generation process and the active center diffusion process are mathematically described. In the model, the two processes are considered separately since they are driven by different fundamental phenomena and occur on different timescales. Evaluation or prediction of the effect of process variables on the curing of a cationic coating of a complex substrate according to the described method allows characterization and understanding of process variables which may save set-up costs and improve production efficiency.

20 Claims, 30 Drawing Sheets

(56) References Cited

U.S. PATENT DOCUMENTS

| | | |
|---|---|---|
| 2006/0052232 A1 | 3/2006 | Bretscher et al. |
| 2008/0214780 A1* | 9/2008 | Adams et al. .................. 528/425 |
| 2008/0268623 A1* | 10/2008 | Bu et al. ......................... 438/511 |
| 2008/0305273 A1 | 12/2008 | Templeman et al. |

OTHER PUBLICATIONS

Nicole Lynn Kenning, "Spatial and Temporal Evolution of the Photoinitiation Rate in Thick Polymer Systems", PhD dissertation, University of Iowa, 2006, http://ir.uiowa.edu/etd/76, 163 Pages.

Miller, G.A. et al., "Modeling of Photobleaching for the Photoinitiation of Thick Polymerization Systems", Journal of Polymer Science: Part A: Polymer Chemistry, vol. 40, pp. 793-808 (2002).

Stephenson, Nicole et al., "Spatial and temporal evoluation of the photoinitiation rate for thick polymer systems illuminated on both sides", Polymer International vol. 54, pp. 1429-1439 (2005).

Kenning, Nicole S. et al., "Spatial and temporal evolution of the photoinitiation rate for thick polymer systems illuminated with polychromatic light", Polymer International vol. 55; pp. 994-1006 (2006).

Kenning, Nicole Stephenson et al., "Spatial and temporal evolution of the photoinitiation rate for thick polymer systems illuminated by polychromatic light: selection of efficient photoinitiators for LED or mercury lamps", Polymer International vol. 57, pp. 1134-1140 (2008).

Ficek, Beth et al., "Lifetimes and Mobility of Cationic Active Centers", Technical Conference Proceedings, Technology Expo & Conference 2008, pp. 209-216.

Ficek, Beth A. et al., "Cationic photopolymerizations of thick polymer systems: Active center lifetime and mobility", ScienceDirect, European Polymer Journal vol. 44 (2008) pp. 98-105.

Steffen Jockusch, et al., "Phosphinoyl Radicals: Structure and Reactivity. A Laser Flash Photolysis and Time-Resolved ESR Investigation" J. Am. Chem. Soc., vol. 120, No. 45, (pp. 11773-11777), 1998.

Cynthia Caroline Hoppe, "Experimental and Theoretical Investigations of Active Center Generation and Mobility in Cationic and Free-Radical Photopolymerizations" A thesis submited in partial fulfillment of the requirements for the Doctor of Philosophy degree in Chemical and Biochemical Engineering in the Graduate College of the University of Iowa, (105 pp.), May 2010.

* cited by examiner

Shadow cure time = 5 minutes

Shadow cure time = 10 minutes

METHOD FOR DETERMINING THE PRODUCTION PARAMETERS FOR A SUBSTRATE COATING PROCESS

BACKGROUND OF THE INVENTION

1. Field of the Invention

The present invention relates to a method to determine the effective production parameters for a UV cationic polymerizable coating system.

2. Discussion of the Background

Photo polymerization technology is conventionally employed for the coating of substrates including, for example, paper, furniture and vinyl flooring. This technology is advantageous in comparison to other known coating methodologies because of lower cost and significantly reduced environmental concern since volatile solvents are not employed.

Of the available UV polymerizable systems, free radical polymerization has until recently, been the technology of choice in applications such as offset printing, lithographic printing and metal coating. However, UV polymerization suffers several disadvantages which must be addressed in industrial applications. The polymerization process depends upon generation and reaction of free radical units which are short-lived and sensitive to destruction by free radical scavengers such as oxygen. Therefore, the system to be coated must be made inert to prevent oxygen inhibition. In addition, due to the extremely short lifetime of free radicals, polymerization via free-radical addition proceeds only as a result of UV irradiation. When irradiation ceases, free radical polymerization quickly terminates.

When coating complex three dimensional substrates, such as an automobile body part, the requirements for successfully applying a free radical polymerizable coating, i.e., application in an oxidation inert environment and full and complete irradiation of the entire substrate surface including areas shaded from the light source prohibit the use of or render free radical polymerization coating processes uneconomical.

Cationic photopolymerization is an alternative technology to free radical polymerization which has several unique advantageous properties especially to facilitate its use in the coating of complex three dimensional substrates. Cationic polymerization proceeds via cationic active centers which are not sensitive to free radical scavengers such as oxygen. Therefore, application in an oxidation inert environment is not necessary. Secondly, in contrast to free radical light-induced polymerizations which experience rapid termination via radical exchange with any local scavenger when illumination ceases, the cationic active centers are non-terminating. They do not combine with one another, and termination occurs predominantly through relatively slow processes such as combination with counter ions or active center entrapment due to polymerization of the surrounding monomer. As a consequence of this non-terminating property, the cationic active centers have extremely long lifetimes which allows the polymerization to proceed post-illumination until monomer is consumed or the reactive center is entrapped in the polymer matrix.

The effects of the post-illumination polymerization inherent in cationic photopolymerization is several fold. Post-illumination the cationic active centers are mobile and migrate throughout the coating, thus polymerizing available monomer. This phenomenon leads to the occurrence of a polymerization front which migrates by a process of reactive center diffusion in all available directions of non-polymerized monomer composition. The continuation of polymerization leads to "dark" polymerization where the polymer matrix continues to form in the absence of light and into a depth of the coating which was not reached by the UV illumination. Thus, cationic photopolymerization may be employed to cure thick systems, i.e., coatings greater than 1 mm in depth. In addition to curing in the depth direction of the coating system, polymerization also proceeds in directions lateral to an axis defining the depth direction. This leads to "shadow" curing where even surface areas shaded from illumination polymerize and cure.

For the coating of complex substrates with cationic curable systems, in an industrial environment, an accurate method including a fundamental model which describes active center generation and both dark and shadow cure may be of great value. Such a method would allow characterization and understanding of the effects of a variety of process variables with a minimum number of experimental or pilot runs, and thus save set-up costs and improve production efficiency.

U.S. Pat. No. 6,833,154 describes a process for radiant curing of a coating on a three dimensional object. The process includes (a) providing a model of a radiant output of at least two lamps to be used to provide the radiant curing of the coating; (b) providing a model of at least one characteristic of a response of the coating to radiant curing; (c) selecting radiant output of the lamps based upon the model of the radiant output; and defining at least a spatial position of the lamps during curing of the coating; (e) defining at least a spatial position of the three dimensional object during curing of the coating; (f) simulating a radiant output of the at least two lamps based on the defined spatial position of the lamps; (g) in response to the simulated radiant output and the defined spatial position of the three-dimensional object during curing of the coating, determining if a predicted radiant output of the at least two lamps on the three-dimensional object will acceptably cure the three dimensional object; and (h) if the radiant output is acceptable, storing a number of the lamps, position of the lamps used in the model of the radiant output, the selected radiant output, and the defined position of the three-dimensional object.

U.S. Pat. No. 6,544,334 describes systems and methods for creating a combinatorial coating library including a coating system operatively coupled to at least one of a plurality of materials suitable for forming at least one coating layer on a surface of one or more substrates. The systems and methods also include a curing system operative to apply at least one of a plurality of curing environments to each of a plurality of regions associated with the at least one coating layer, the curing system comprising a plurality of waveguides each having a first end corresponding to at least one of a plurality of regions and a second end associated with at least one curing source. The combinatorial coating library comprising a predetermined combination of at least one of the plurality of materials and at least one of the plurality of curing environments associated with each of the plurality of regions.

U.S. Pat. No. 6,490,501 describes a monitoring and control system for use in curing composite materials including a model for a workpiece being cured. The model calculates current internal states of the workpiece and predicts, based upon past and current states of the workpiece, future states of the cure process. These future states are represented as virtual inputs to the controller, which controls operation of the cure process based upon both real and virtual inputs. Cure rates are affected by both external temperatures and internal heat generated by the curing process itself. The internally generated heat is considered by the model when calculating current states and predicting future states. By projecting the cure state into the future, problems caused by high cure rates can be avoided. In addition, pressure can be optimally controlled in response to estimated internal material state.

U.S. Pat. No. 5,182,056 describes a stereolithographic apparatus and a method for generating a part from curable material. The invention utilizes control and/or knowledge of depth of penetration of actinic radiation into a vat of photopolymer to determine and/or control and/or produce desirable characteristics associated with the creation of parts. From a predictive point of view, such characteristics may include determination of cure depth from a given exposure, determination of cure width, determination of required minimum surface angle, determination of optimum skin fill spacing, the strength of cross sections of partially polymerized material, amount of curl type distortion and necessary overcure to attain adhesion between layers. These determinations can lead to the use of particular building techniques to insure adequate part formation. From the controlling and producing point of view, the penetration depths can be controlled to obtain optimized for a given layer thickness, maximized speed of drawing, minimized print through, maximized strength, minimum curl and other distortions, and maximum resolution, etc. Resin characteristics may be integrated with the depth of penetration associated with the particular resin being used and the wavelength(s) of actinic radiation being used to solidify it, and with the intensity profile of the beam of actinic radiation as it strikes the resin surface.

U.S. Patent Application Publication 2004/0148051 describes a modeling method for minimizing the cure time and flow time of a thermoset in-mold coating for a molded article. The minimization of cure time is based on determining the cure time as a function of mold temperature and initiator level. The method for minimizing flow time is based on predicting the fill pattern for a specific geometry mold. The methods may be used to reduce cycle time in the preparation of in-mold coated parts and reduce defects in the appearance of the coating.

However, none of these references are directed to U.V. curable cationic polymerization system and none consider migration of cationic active centers post illumination.

U.S. Patent Application Publication 2008/0305273 describes a method of applying a polymer coating to a complex three dimensional substrate. The substrate, such as a automotive vehicle body, is coated with a combination of a coating formulation and a photoactivated mixture containing active centers that have been produced prior to application. The two liquids can be intimately mixed prior to application to the object, or the coating formulation can be applied prior to the application of the photoactivated mixture. The coating formulation is cured by the active centers that have been produced prior to application.

However, this reference does not describe a method for determining or predicting the optimum process parameters which provide efficient and effective curing of the coating.

SUMMARY OF THE INVENTION

An object of the present invention is to provide a method to determine production parameters for a coating application of a UV polymerizable coating system to a substrate. Applicants have investigated both the shadow and dark cure processes and have developed a model which describes both the active center generation process and the active center diffusion process. In the model, the two processes are considered separately since they are driven by different fundamental phenomena and occur on different timescales. Employing this model, a method to evaluate or predict the effect of process variables on the curing of a cationic coating, given known or determined system parameters is provided. The method may be employed to evaluate the expected performance of a potential new coating system or to optimize production parameters for a operating coating system.

It is an object of the present invention to provide a method to accurately evaluate the effect of specific variables and predict a model set of conditions to effectively and efficiently determine operating conditions for application of a cationic coating system to a complex substrate such as an automobile surface.

A further object of the present invention is to provide a method to determine and predict the effect of potential modification of process parameters on a coating application without employing tedious and costly pilot experimentation.

This and other objects, individually or in combinations thereof, have been achieved by the present invention, a first embodiment of which includes a method for evaluating a UV polymerizable cationic system for coating performance on a substrate, comprising:

a) selecting a UV polymerizable cationic system to investigate for coating performance;

b) identifying or selecting core and mesh variables for the selected UV polymerizable cationic coating system;

c) estimating a coating cure for the selected UV polymerizable cationic coating system in spatial dimensions of depth and width by numerical solution of a Polychromatic Governing Set of Equations based on the identified core and mesh variables; and d) evaluating the selected coating system based on the obtained estimated cure depth and width;

wherein the Polychromatic Governing Set of Equations calculates a concentration of cationic active centers produced during a UV illumination period and a diffusion of the cationic active centers in the two spatial dimensions during a specified period of time following termination of the illumination, and the core variables comprise a value of a diffusion coefficient for cationic active center of migration post illumination.

Another object achieved by the present invention according to a second embodiment includes a method for optimizing production parameters for a UV polymerizable cationic coating system on a substrate having specific curing requirements, comprising:

a) identifying or selecting core and mesh variables for the UV polymerizable cationic coating system;

b) estimating a coating cure for the selected UV polymerizable cationic coating system in spatial dimensions of depth and width by numerical solution of a Polychromatic Governing Set of Equations based on the identified core and mesh variables; and c) evaluating the obtained estimated cure depth and width with respect to the substrate curing requirements;

wherein the Polychromatic Governing Set of Equations calculates a concentration of cationic active centers produced during a UV illumination period and a diffusion of the cationic active centers in the two spatial dimensions during a specified period of time following termination of the illumination, and the core variables comprise a value of a diffusion coefficient for cationic active center migration post illumination.

The foregoing paragraphs have been provided by way of general introduction, and are not intended to limit the scope of the following claims. The presently preferred embodiments, together with further advantages, will be best understood by

BRIEF DESCRIPTION OF THE DRAWINGS

FIG. 7 shows 3-dimensional plots of cationic active center concentration profiles for zero minutes through 10 minutes of post-illumination time.

DETAILED DESCRIPTION OF THE INVENTION

Figure 1:
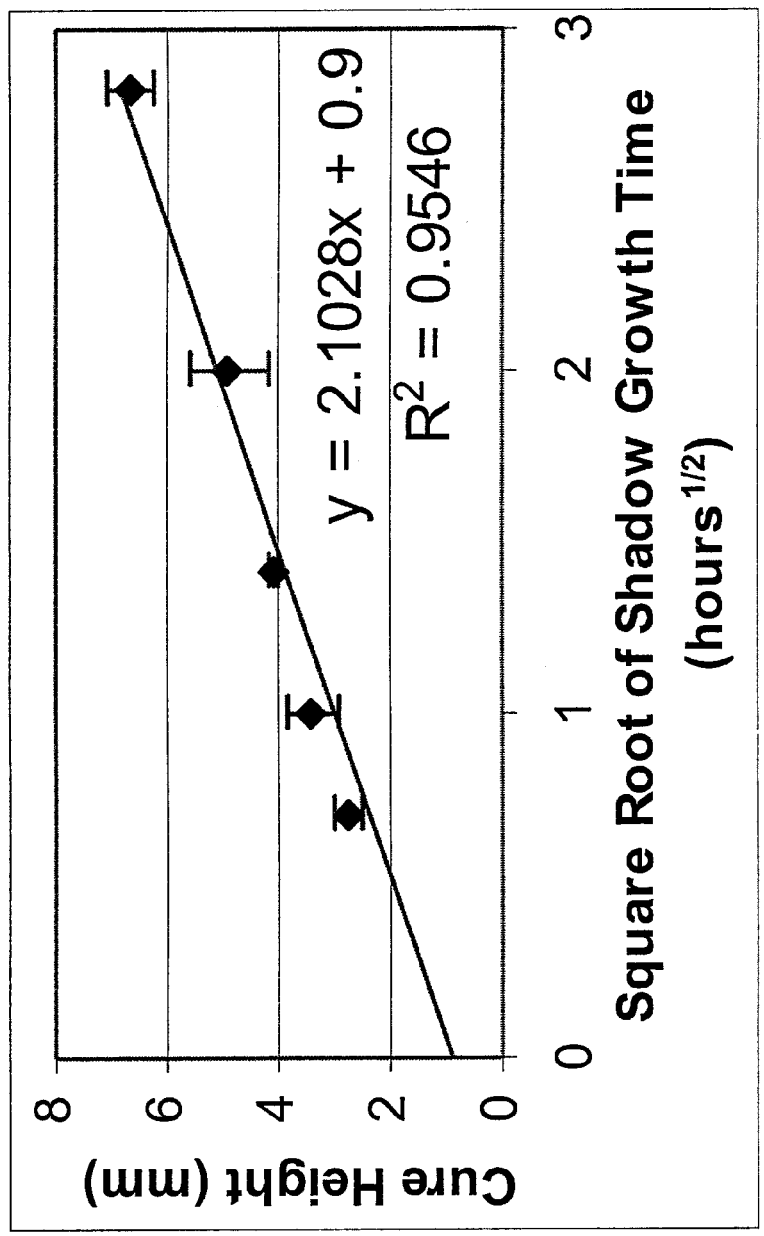
FIG. 1 shows the shadow cure dependence on the square root of time.

It is an object of the present invention to provide a method to accurately evaluate the effect of specific variables and predict a model set of conditions to effectively and efficiently determine operating conditions for application of a UV cationic polymerizable coating system to a complex substrate such as an automobile surface.

A further object of the present invention is to provide a method to determine and predict the effect of potential modification of process parameters on a coating application without employing tedious and costly pilot experimentation.

Another object of the present invention is to provide a method to evaluate the performance of a potential new or modified UV cationic polymerizable coating system.

These and other objects, individually or in combinations thereof, have been achieved by the present invention, a first embodiment of which includes a method for evaluating a UV polymerizable cationic system for coating performance on a substrate, comprising:

a) selecting a UV polymerizable cationic system to investigate for coating performance;

b) identifying or selecting core and mesh variables for the selected UV polymerizable cationic coating system;

c) estimating a coating cure for the selected UV polymerizable cationic coating system in spatial dimensions of depth and width by numerical solution of a Polychromatic Governing Set of Equations based on the identified core and mesh variables; and d) evaluating the selected coating system based on the obtained estimated cure depth and width;

wherein the Polychromatic Governing Set of Equations calculates a concentration of cationic active centers produced during a UV illumination period and a diffusion of the cationic active centers in the two spatial dimensions during a specified period of time following termination of the illumination, and the core variables comprise a value of a diffusion coefficient for cationic active center migration post illumination.

Another object achieved by the present invention according to a second embodiment includes a method for optimizing production parameters for a UV polymerizable cationic coating system on a substrate having specific curing requirements, comprising:

a) identifying or selecting core and mesh variables for the UV polymerizable cationic coating system;

b) estimating a coating cure for the selected UV polymerizable cationic coating system in spatial dimensions of depth and width by numerical solution of a Polychromatic Governing Set of Equations based on the identified core and mesh variables; and c) evaluating the obtained estimated cure depth and width with respect to the substrate curing requirements;

wherein the Polychromatic Governing Set of Equations calculates a concentration of cationic active centers produced during a UV illumination period and a diffusion of the cationic active centers in the two spatial dimensions during a specified period of time following termination of the illumination, and the core variables comprise a value of a diffusion coefficient for cationic active center migration post illumination.

Cationic coating systems having a wide variety of monomer systems are commercially available and provide flexibility of coating formulation having selected coating properties.

Conventional systems include monofunctional or difunctional epoxides, high molecular weight epoxy oligomers, epoxy resins, epoxidized seed oils, cyclic sulphides, vinyl ethers, cyclic ethers, cyclic formals, cyclic acetals, cyclic lactones and cyclic siloxanes. Typically, these systems involve a ring opening polymerization of oxiranes and/or oxetanes initiated by protonic acid generated by photolysis of diaryliodonium or triarylsulfonium salts. Examples of epoxidized oils include epoxidized linseed oil, epoxidized corn oil, epoxidized soybean oil and vernonia oil. Examples of conventionally employed monomers are 3,4-epoxy-cyclohexyl-methanyl-3,4-epoxycyclohexanecarboxylate (CDE) and 2-butoxymethyl oxetane.

The number of efficient iniators for photo-catalyzed cationic polymerizations is growing and the available range allows a wide selection of initiating wavelengths.

Common photoiniators include (4-methylphenyl)[4-(2-methylpropyl)phenyl]-iodium hexafluorophosphate, (tolyl-cumyl) iodium tetrakis (pentafluorophenyl) borate (IPB), 4,4'-dimethyldiphenyl iodonium hexafluorophosphate, diaryl iodonium tetrakis (pentafluorophenyl) borate salts, diaryliodonium hexafluoroantimonate salts (IHA), triaryl sulfonium hexafluorophosphate salts and triaryl sulfonium hexafluoro-antimonate salts. The optical yield values for the photoinitiators are generally available in the literature or from commercial photoinitiator suppliers.

In the method of the present invention, core variables are provided to a Polychromatic Governing Set of Equations, which are numerically solved employing the provided variables. Such parameters may include identification of a monomer system, a photoinitiator system, concentration of the photoiniator, type and intensity of illumination to be applied, time of illumination and curing temperature. These variables are directed to characteristics such as the energy supply and consumption of the system and include, but are not limited to the initial concentration of the photoinitiator, an optical yield value of the photoinitiator, a total energy intensity of an irradiation source which provides the UV boundary of illumination, a shadow with and a wavelength range of the UV illumination. The absorbance spectrum for each system component, i.e., photoinitiator, monomer, additive, if present, and photolysis products of these is considered and accounted in the solution of the Polychromatic Governing Set of Equations. The emission spectrum of the illumination source is included in a similar manner.

The numerical solution of the Polychromatic Governing Set of Equations may be obtained via commercially available scientific software programs. Such commercial scientific software is available in the MATLAB® software series provided by The MathWorks™ company.

The UV boundary of illumination corresponds to the wavelength range of overlap between the photoinitiator absorption spectrum and the emission spectrum of the source of the UV illumination.

The mesh variables are variables associated with the solution of the Polychromatic Governing Set of Equations and include a depth increment, a UV illumination time increment, a shadow cure increment; and a width increment.

The cationic active centers are produced by photolysis of the cationic initiator during illumination. This photolysis reaction may be described by the absorption equation and the quantum yield. To accurately describe the spatial photoinitiation profiles produced during illumination, change of the photoinitiator concentration profile due to initiator consumption upon illumination must be accounted for. The depth of polymer formation during illumination depends upon factors which include wavelength and intensity of the illuminating light, photoinitiator concentration and absorbance and exposure time. The active center concentration may be calculated by the method of Stephenson et al. (Polymer Inter. 54, 1429-1439 (2005)) The analysis is based upon the following differential equations which govern the evolution of the light intensity gradient and photoinitiator concentration gradient for multi-wavelength illumination. According to the present invention these equations will be designated as the Polychromatic Governing Set of Equations.

$$\frac{\partial C_i(z,t)}{\partial t} = -\frac{C_i(z,t)}{N_A h} \sum_j \frac{[\epsilon_{ij}\phi_{ij}I_j(z,t)]}{v_j} + D_i \frac{\partial^2 C_i(z,t)}{\partial z^2} \quad (1)$$

$$\frac{\partial C_p(z,t)}{\partial t} = -\frac{C_i(z,t)}{N_A h} \sum_j \frac{[\epsilon_{ij}\phi_{ij}I_j(z,t)]}{v_j} + D_p \frac{\partial^2 C_p(z,t)}{\partial z^2} \quad (2)$$

$$\frac{\partial I_j(z,t)}{\partial z} = -[\epsilon_{ij}C_i(z,t) + A_{mj} + \epsilon_{pj}C_p(z,t)]I_j \quad (3)$$

wherein j is an index indicating the wavelength of light under consideration, $C_i$ (z, t) is the initiator molar concentration at depth z and time t, $C_p$ (z, t) is the photolysis product molar concentration at depth z and time t, I(z,t) is the incident light intensity of a specific wavelength at z and t in units of energy/(area*time), $\epsilon_{ij}$ is the iniator Napierian molar absorptivity of a specific wavelength in units of volume/(length*mole), $\epsilon_{pj}$ is the photolysis product Naperian molar absorptivity of a specific wavelength with units of volume/(length*mole), $\phi_{ij}$ is the quantum yield if the initiator, defined as the fraction of absorbed photons that lead to fragmentation of the initiator, $N_A$ is Avogadro's number, h is Planck's constant, $v_j$ is the frequency of light in units of inverse seconds, $D_i$ is the diffusion coefficient of the initiator in units of length²/time, $D_p$ is the diffusion coefficient of the photolysis products in units of length²/time, and $A_m$ is the absorption coefficient of the monomer and the polymer repeat unit in units of inverse length.

The absorption of the photolysis product is negligible for photobleaching initiators, while diffusion of the initiator during the illumination period is neglected and the quantum yield of the photoinitiator may be found in the literature.

Figure 4:
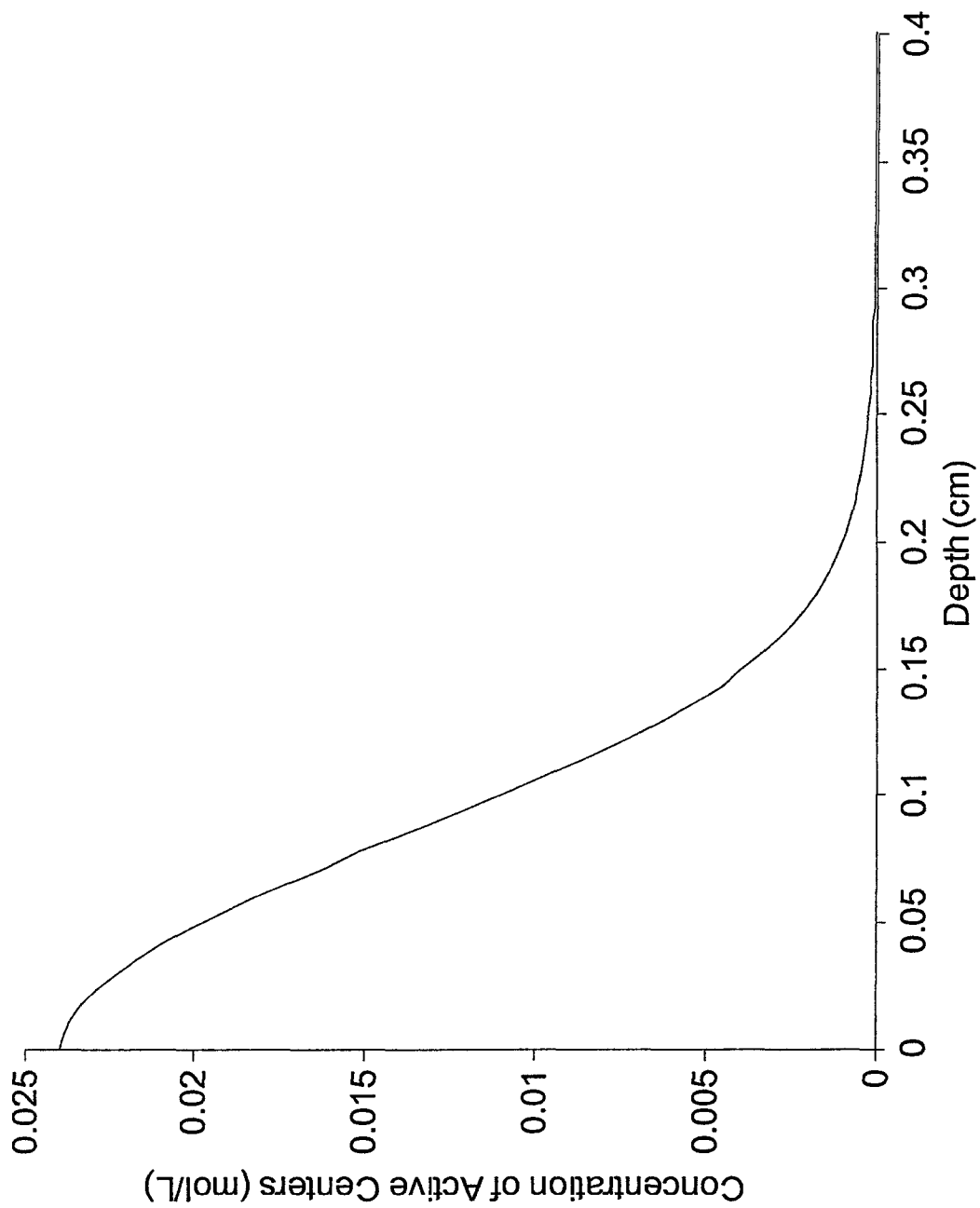
FIG. 4 shows the change of active center concentration profile with time.

Modeling experiments have shown that the photoiniator is completely consumed at the illuminated surface. The distance of light penetration into the sample and corresponding active center production increases with increasing time. A sharp drop in active center concentration to a value of zero occurs at the leading edge of illumination. This is shown in FIG. 4 and described in Example 3.

Figure 5:
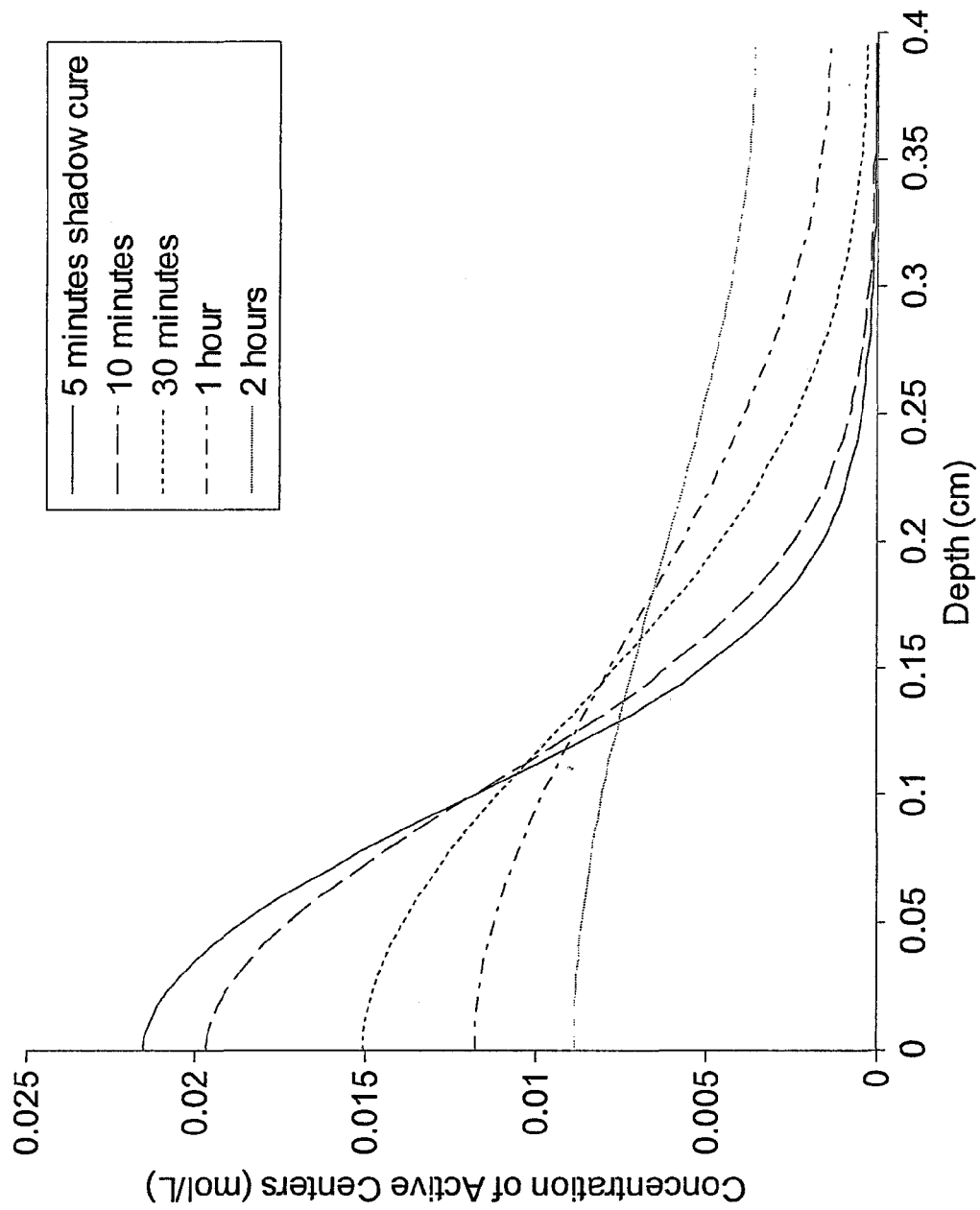
FIG. 5 shows the modeled active center spatial profile of shadow cure with time.

The active center concentration upon completion of illumination provides the initial conditions for the shadow cure active center diffusion calculation. As illustrated in FIG. 4, these profiles fall off rapidly and therefore exhibit a sharp gradient and a considerable driving force for diffusion. According to Fick's second law, the diffusion can be related to the concentration profile using equation (4):

$$\frac{\partial C_{ac}(z,t)}{\partial t} = D_{ac}\frac{\partial^2 C_{ac}(z,t)}{\partial z^2} \quad (4)$$

where $C_{ac}(z,t)$ is the active center initiator molar concentration at depth z and time t and $D_{ac}$ is the diffusion coefficient of the active center in units of length$^2$/time. FIG. 5 contains shadow cure profiles obtained using this equation for the conditions shown previously in FIG. 4 (the 5 minute active center profile from FIG. 4 was used as the starting condition for the active center diffusion). FIG. 5 illustrates that, the active center profile broadens and extends deeper into the sample as shadow cure time is increased due to active center diffusion. As indicated in Example 4, a threshold value of active center concentration required to fully cure surrounding monomer based on data analysis is 0.0013±0.0003 mol/L.

Figure 6:
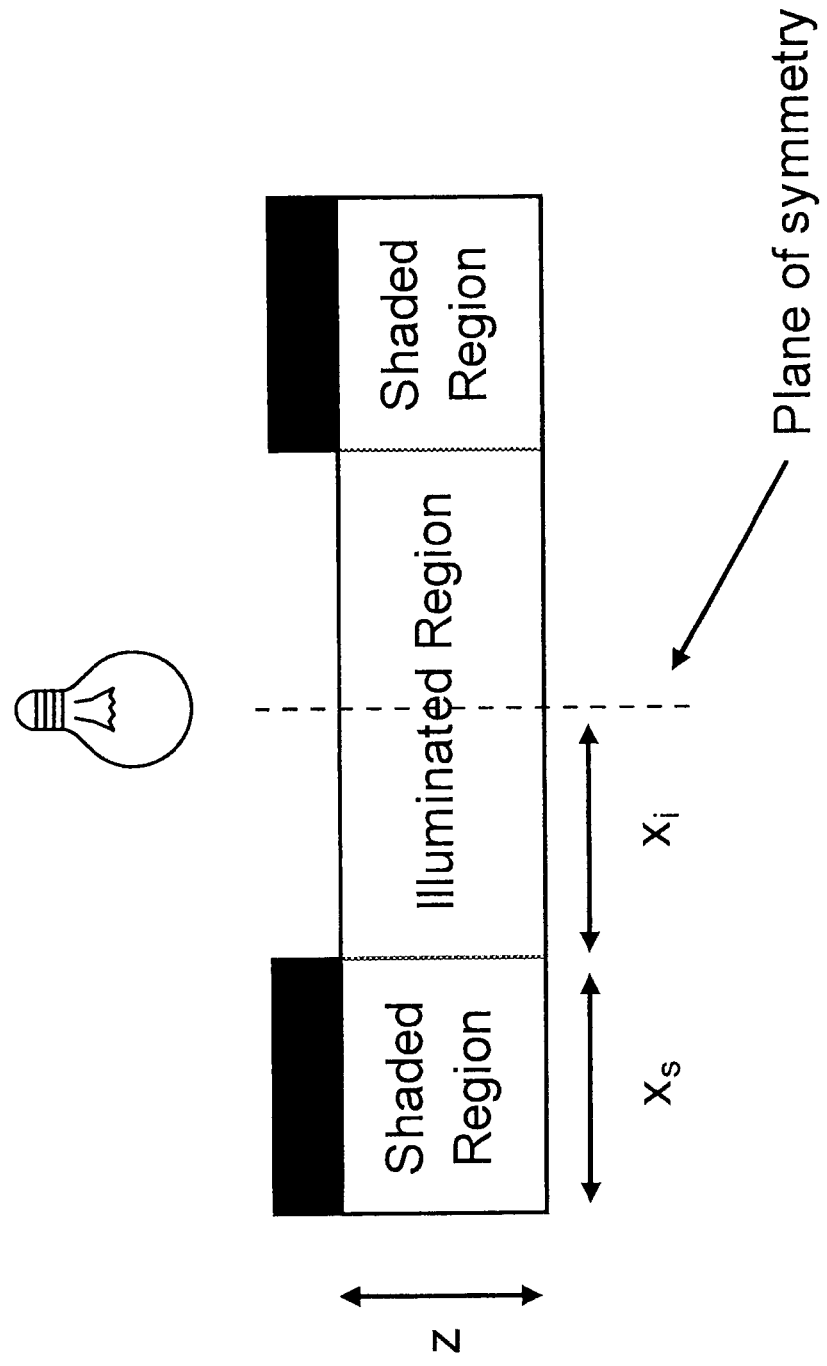
FIG. 6 shows the spatial geometrical relationship upon which the Polychromatic Governing Set of Equations are based.
Figure 7A:
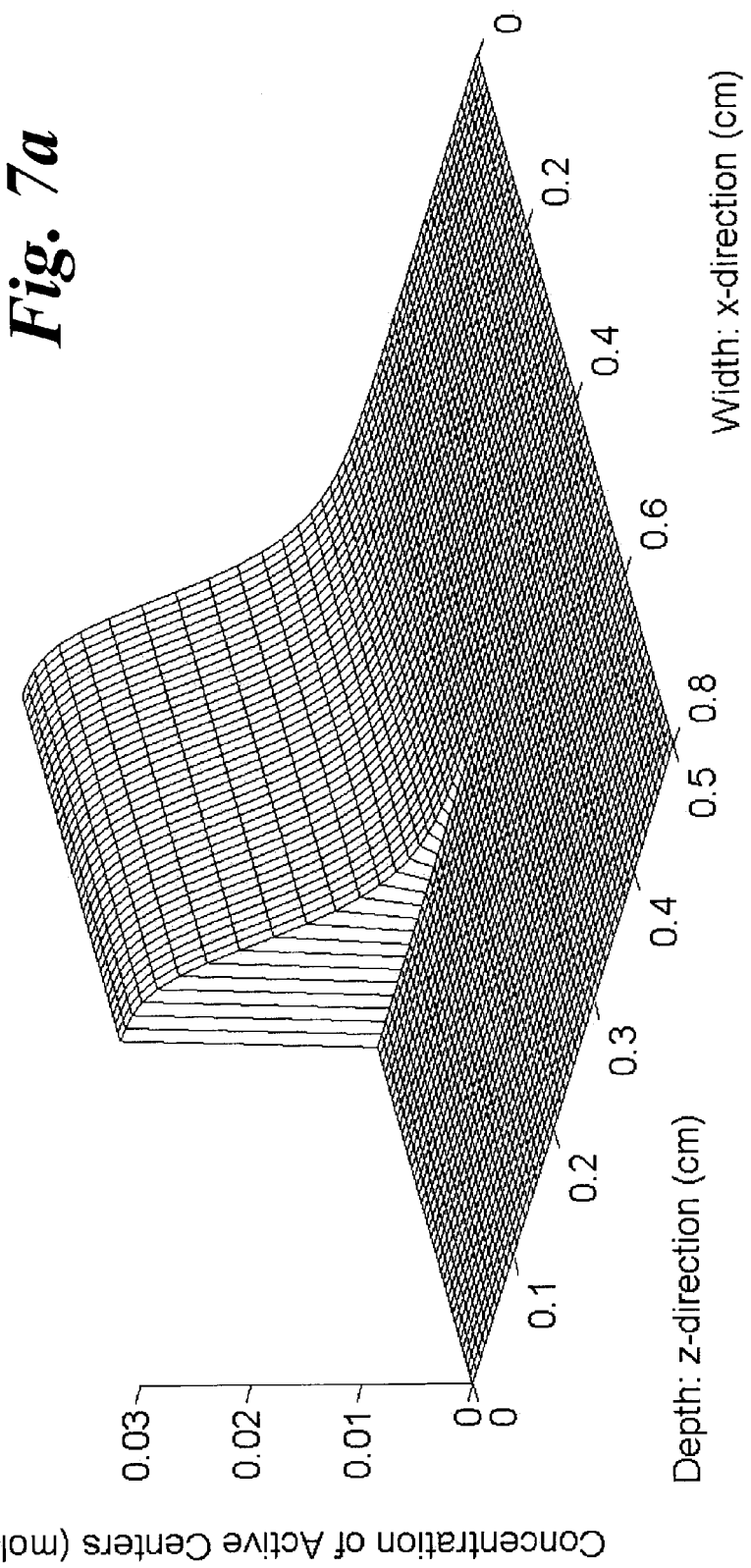
FIG. 7A is 0 shadow cure time.
Figure 7B:
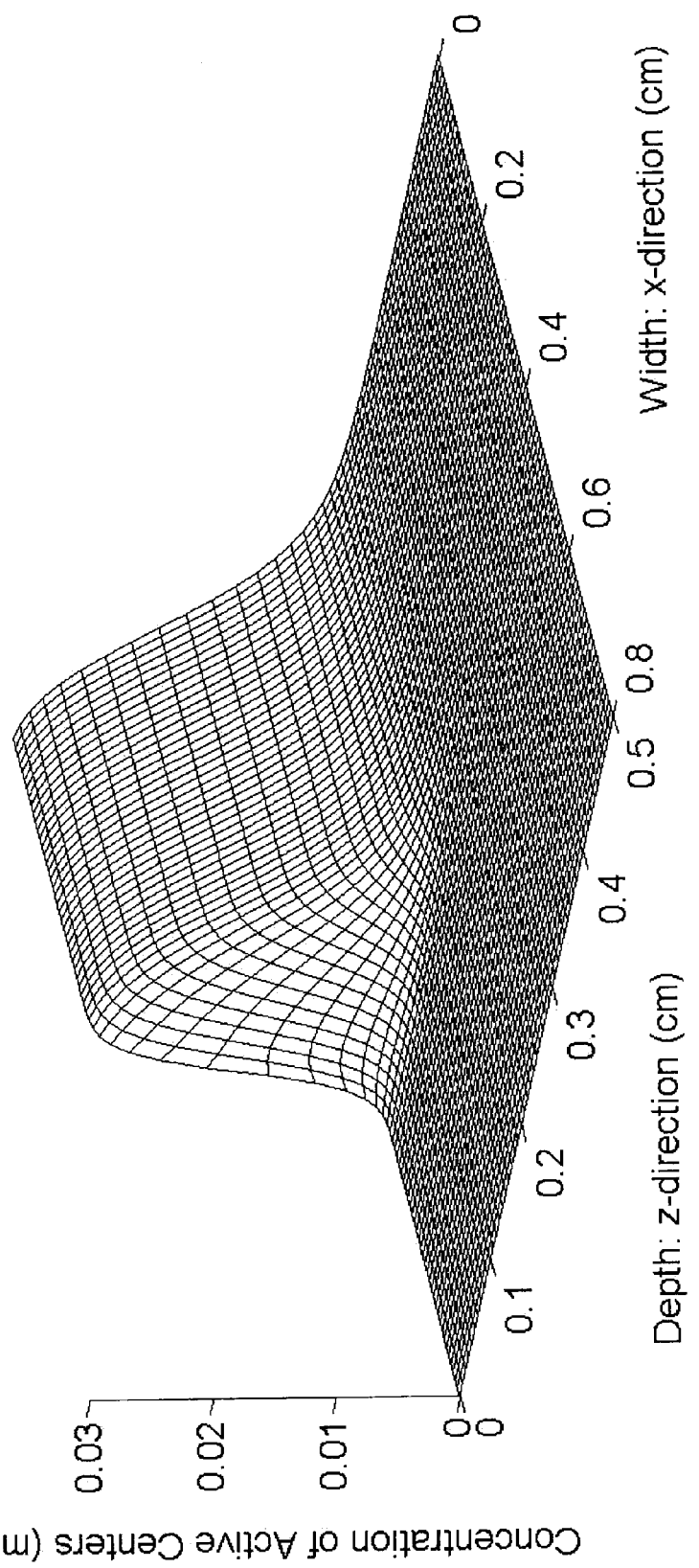
FIG. 7B is 30 seconds shadow cure time.
Figure 7C:
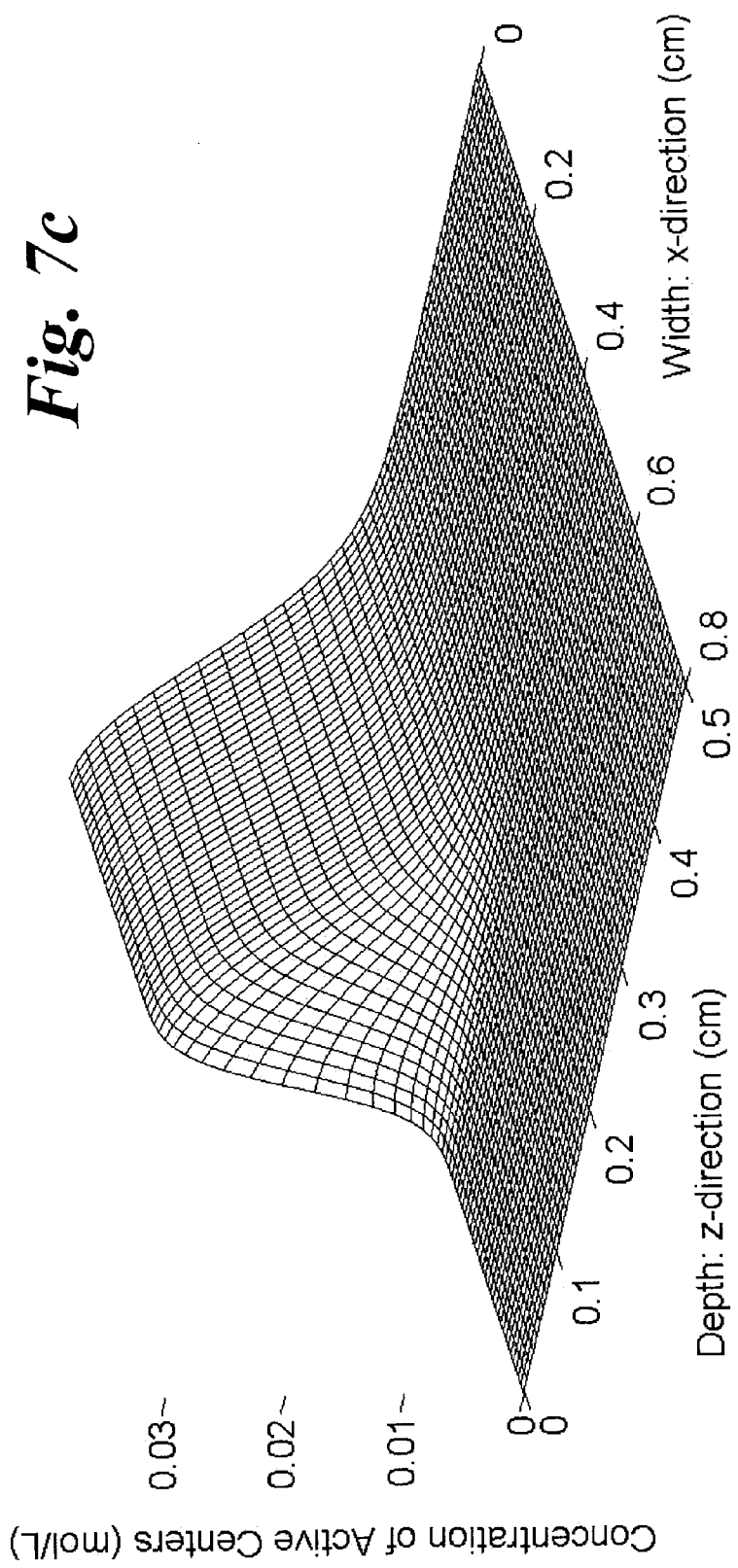
FIG. 7C is 1 minute shadow cure time.
Figure 7D:
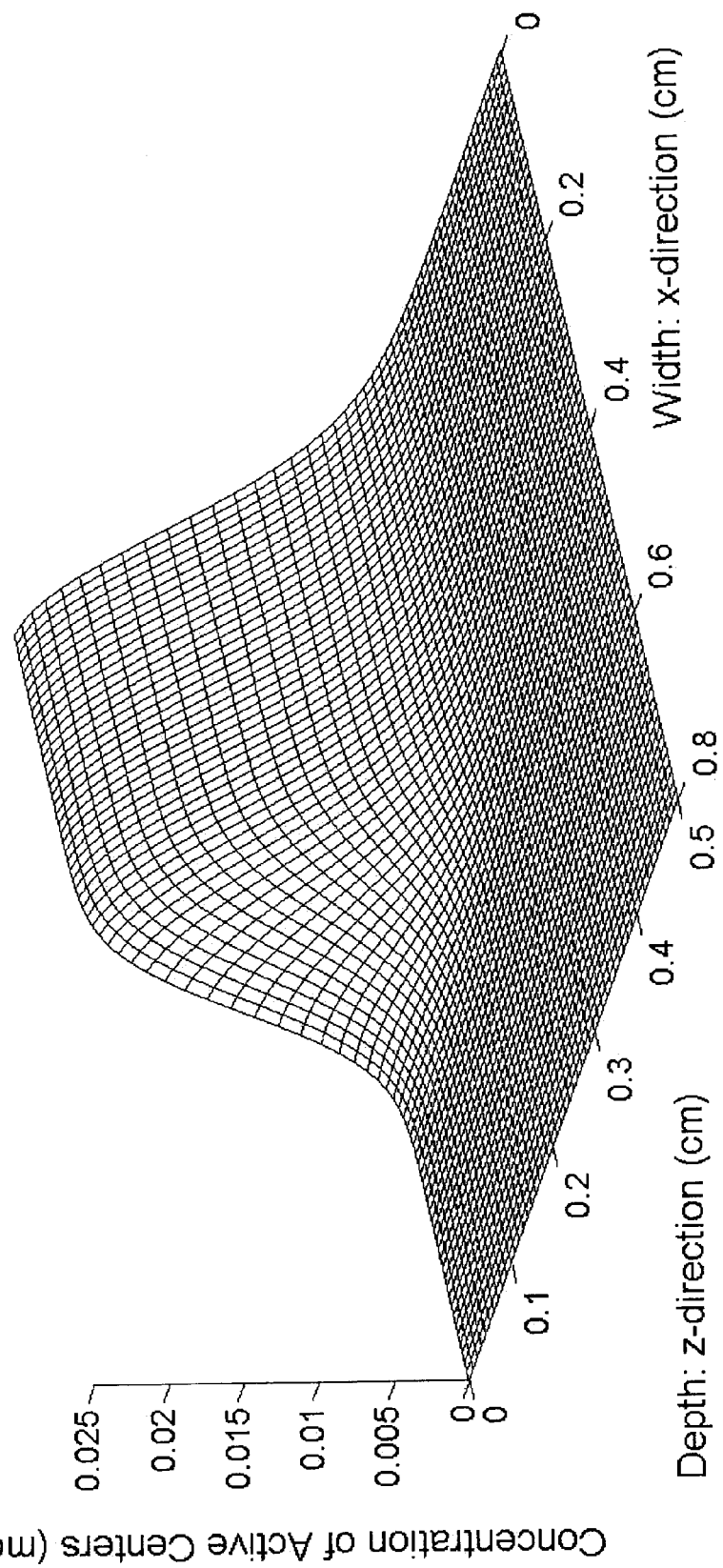
FIG. 7D is 2 minutes shadow cure time.
Figure 7E:
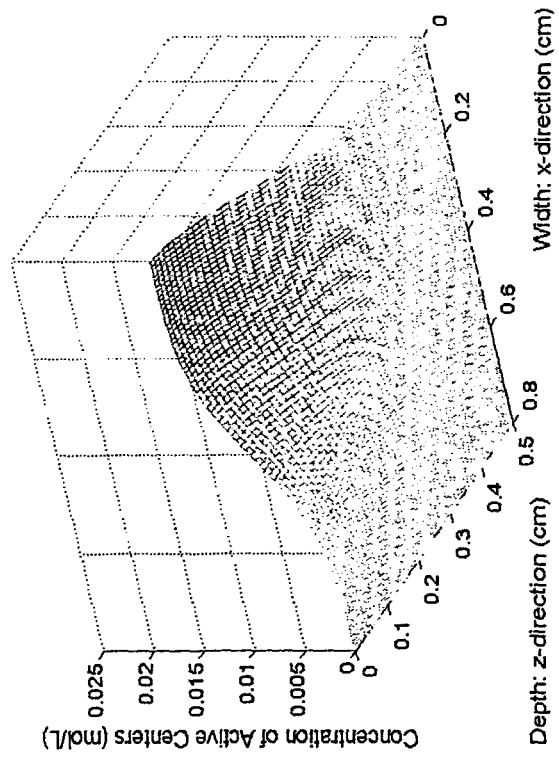
FIG. 7E is 5 minutes shadow cure time.
Figure 7F:
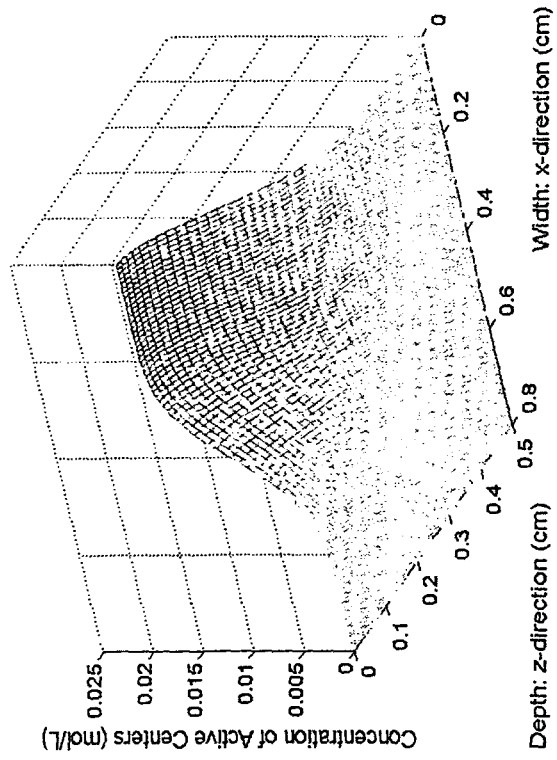
FIG. 7F is 10 minutes shadow cure time.

The Polychromatic Governing Set of Equations include description of active center diffusion both in the direction parallel to initial illumination and in the direction perpendicular to the initial illumination. FIG. 6 shows a schematic of the geometrical configuration employed to investigate multidimensional shadow cure. In the simple geometry of FIG. 6, a system with depth z and width x has alternating masked and exposed regions. Due to the plane of symmetry in the center of the geometrical configuration, the system may be divided into two equivalent systems which are mirror images of one another. Therefore, the fundamental analysis of active center generation and diffusion can be applied to only one half as shown. In FIG. 6, the illumination area of width $x_i$ is exposed to the illumination source and the shadow area of width $x_s$ is masked.

Diffusion from the illuminated region into the shadow region is governed by Fick's second law applied in two spatial dimensions (5):

$$\partial C_{ac}(t,x,z)/\partial t = D_{ac}[\partial^2 C_{ac}(t,x,z)/\partial x^2 + \partial^2 C_{ac}(t,x,z)/\partial z^2] \quad (5)$$

where $C_{ac}(t,x,z)$ is the active center molar concentration at time t, depth z and width x, and $D_{ac}$ is the diffusion coefficient of the active center in units of length$^2$/time. The initial condition for the concentration is the profile obtained from the active center generated profile at the termination of illumination.

In addition, the no flux boundary conditions are used for the illumination surface and plane of symmetry (6):

$$\partial C_{ac}(t,x,z=0)/\partial z = 0 \quad \partial C_{ac}(t,x=0,z)/\partial x = 0 \quad (6)$$

A finite-difference numerical solution to the multidimensional second order differential equation obtained by numerical solution of the Polychromatic Governing Set of Equations according to the present invention provides a profile of the active center concentration at a selected shadow cure time.

Such analysis provides curing depth and width data and determines the conditions necessary to achieve complete cure of a three dimensional surface.

As indicated in Example 6, the method of the present invention may be applied to UV polymerizable cationic systems containing pigments. While photopolymerization is known for clear coats on a variety of substrates, light-induced cure of systems containing additives that interact with light may be problematic. As a result, the curing of pigmented systems may be incomplete and/or uneven. Application of the method of the present invention to UV polymerizable cationic coating allows the artisan in such coating systems to effectively evaluate and optimize curing performance in pigmented systems.

Having generally described this invention, a further understanding can be obtained by reference to certain specific examples which are provided herein for purposes of illustration only, and are not intended to be limiting unless otherwise specified.

EXAMPLES

Example 1

Characterization of Shadow Cure

The extent of shadow cure as a function of time was determined for a system containing 3,4-epoxy-cyclohexylmethanyl 3,4-epoxycyclohexane-carboxylate (CADE) as monomer and 0.5 mol % (tolylcumyl)iodonium tetrakis (pentafluorophenyl) borate (IPB) as initiator. The exposure time was 5 minutes at 25° C., while the shadow cure temperature was 50° C. The experiments were performed using disposable polystyrene cuvettes which were chosen because they are transparent to the wavelength of interest but may readily be dissolved to determine where polymerization occurred. Each monomer-filled cuvette was illuminated from below with the light from a 200 W Hg/Xe lamp for a prescribed duration. A typical exposure time was five minutes. Since the density of the formed polymer is greater than the reaction mixture, illumination from below avoided polymerization-induced convection or mixing. After this exposure, the system was maintained at the prescribed temperature for the predetermined shadow cure time. In each cuvette, the polymerization was observed to begin at the bottom of the sample (due to the illumination from below with a penetration depth no more than 1.5 millimeters) and a polymerization front moved toward the top of the sample (unilluminated shadow regions). At the prescribed shadow cure time, the sample was placed in tetrahydrofuran (THF) to dissolve the cuvette and monomer from the uncured region of the sample. The remaining crosslinked polymer was then washed with acetone to remove the any remaining THF and excess monomer. The polymer sample was dried and its weight was recorded. The polymerized thickness was determined by dividing the weight of the polymer sample by its density and the area of illuminated surface (the cross-sectional area of the cuvette, 1 cm$^2$). At each temperature an unilluminated sample was used as a control to verify that thermally-induced polymerization did not occur. This experimental protocol based upon the weight of the polymerized sample provided much more precise and repeatable data than methods based upon drawing off unreacted monomer. In addition, the general shape and nature of the polymerization from was more accurately identified using this experimental method.

Using the method described above, the effect of time on the shadow cure distance was examined. As shown in FIG. 1, the polymerized height had a square root dependence on time. This dependence is consistent with the shadow cure being driven by active center diffusion. The square-root-of-time dependence arises from the diffusion equation, shown in equation 7.

$$<x> = \sqrt{4Dt/\pi} \quad (7)$$

Fitting the experimental data to this equation yielded an effective shadow cure diffusion coefficient of 3×10$^{-6}$ cm$^2$/sec.

Example 2

Determination of Effect of Temperature on the Observed Shadow Cure Distance

A series of experiments were performed to determine the effect of temperature on the observed shadow cure distance. Experimental results are shown in FIG. 2.

Figure 2:
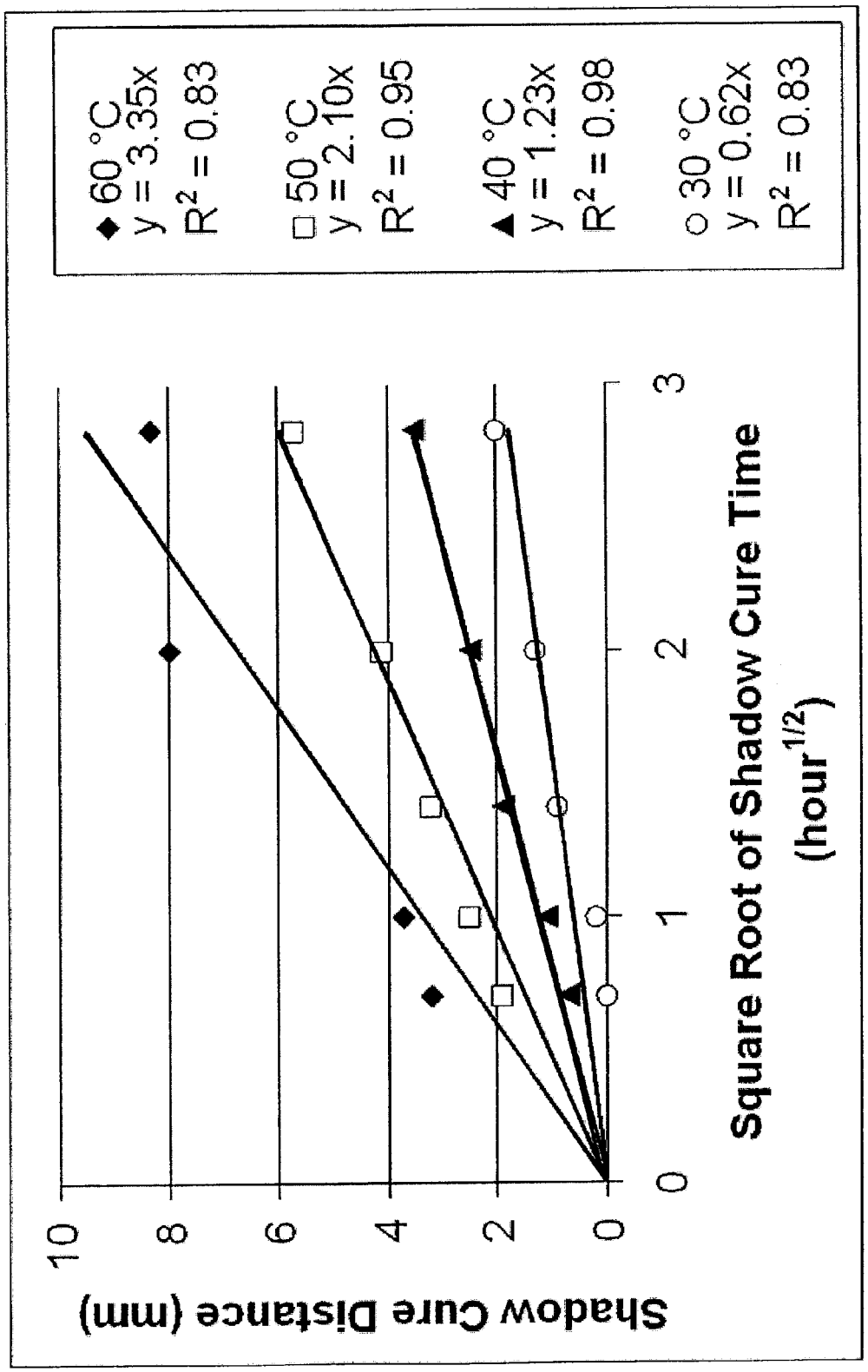
FIG. 2 shows the effect of temperature on shadow cure distance.
Figure 3:
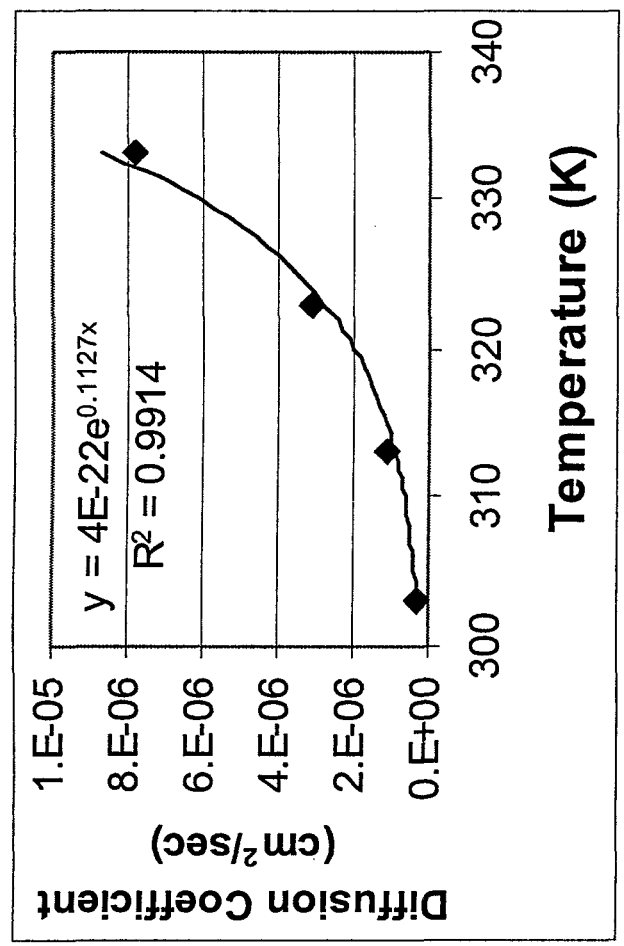
FIG. 3 shows the effect of temperature on the shadow cure diffusion coefficient.

For each temperature shown in FIG. 2, the shadow cure distance increased in a manner proportional to the square root of the shadow cure time (Equation 1). In addition, the diffusion coefficient (indicated by the slope of the line, which corresponds to the square root of 4D/π) increased with increasing temperature. The temperature dependence of the effective shadow cure diffusion coefficient is illustrated in FIG. 3 and is well described by the Arrhenius equation. As the temperature was increased, the polymer chains became more mobile and allowed the active centers to progress easier to the leading edge of the polymer sample. The diffusion coefficient followed an Arrhenius dependence on the temperature as shown in FIG. 3.

Example 3

Movement of Active Center Concentration with Illumination Time

Active center concentration profiles calculated for standard experimental conditions are shown in FIG. 4. These modeling results illustrate that the photoinitiator is completely consumed at the illuminated surface of the sample (the maximum photoinitiator concentration is equal to the photoinitiator concentration (0.0262 moles/liter) since each photoinitiator molecule leads to the formation of a single active center. The distance of light penetration into the sample (and corresponding active center production) increased with increasing time, with a sharp drop in active center concentration to a value of zero at the leading edge of the illumination.

Example 4

Active Center Diffusion with Time

The active center concentrations at the end of the illumination step described in the previous section provided the initial conditions for shadow cure active center diffusion calculations. As illustrated in FIG. 4, these profiles fell off rapidly and therefore exhibited a sharp gradient and a considerable driving force for diffusion. According to Fick's second law, the diffusion can be related to the concentration profile using the following equation.

$$\frac{\partial C_{ac}(z,t)}{\partial t} = D_{ac}\frac{\partial^2 C_{ac}(z,t)}{\partial z^2} \quad (4)$$

Here, $C_{ac}(z,t)$ is the active center initiator molar concentration at depth z and time t and $D_{ac}$ is the diffusion coefficient of the active center in units of length$^2$/time. FIG. 5 contains shadow cure profiles obtained using this equation for the conditions shown previously in FIG. 4 (the 5 minute active center profile from FIG. 4 was used as the starting condition for the active center diffusion). FIG. 5 illustrates that, the active center profile broadens and extends deeper into the sample as that shadow cure time is increased due to active center diffusion.

Example 5

Multidimensional Shadow Cure Results

Using the active center concentration profile shown in FIG. 4 described in Example 3, as an initial condition, Fick's second law applied in two spatial dimensions $$\partial Cac(t,x,z)/\partial t = Dac[\partial 2Cac(t,x,z)/\partial x2 + \partial 2Cac(t,x,z)/\partial z2] \quad (8)$$

was numerically solved for Shadow cure times of 30 seconds, 1, 2, 5 and 10 minutes and plotted in 3-dimensional space. The shadow cure profiles obtained are shown in FIG. 7.

The simulation results for this representative case of multidimensional shadow cure illustrate that as the shadow cure time increases from zero to 10 minutes, the active center profile broadens and extends deeper into the sample in the z-direction. In addition, FIG. 4 illustrates that active centers diffuse into the unilluminated region behind the mask in the x-direction with increasing post-illumination time. Indeed, the driving force for diffusion is higher in the x-direction than it is in the z-direction due to the steeper active center concentration gradient.

Example 6

Shadow Cure in Pigmented Systems

UV cationic polymerization systems containing three pigments, were studied to investigate their effect on the cationic active center mobility. For each pigment, the effect on cationic active center generation and mobility was explored using models based on numerical solution of the Polychromatic Governing Set of Equations. The photoinitiator (tolycumyl)iodonium tetrakis (pentafluorophenyl) borate (IPB, Secant Chemicals) and the monomer 3,4-epoxy-cyclohexylmethanyl 3,4-epoxycyclohexanecarboxylate (CDE, Dow Chemical Co,) were used in these simulations. The pigments studied were Titanium dioxide (TiO$_2$), Quinacridone Red, and Phthalocyanine Blue. Monomer and pigment absorptivities were determined in one nanometer increments using an Agilent UV-VIS spectrometer. The formulations modeled contained 0.5 mol % photoinitiator (IPB) and 1 wt % pigment in CDE. The illumination time was 5 minutes, using a 200 W Oriel Hg—Xe arc lamp with an irradiance of 50.0 mW/cm$^2$. The IPB diffusion coefficient for the systems studied was 3.07×10$^{-6}$ cm$^2$/sec., as determined in previous shadow cure experiments.

A MATLAB multi-wavelength simulation model was used to calculate the concentration of active centers produced during illumination. This data was then used as input to the shadow cure diffusion model, which calculated the active center diffusion as a function of depth over a specified post-illumination time using equation (5). The average absorptivities of the three pigments from 295-307 nm, the wavelength range of interest, were determined as shown in the following Table based on 1 wt % pigment loading.

| Pigment | Average absorptivity (cm$^{-1}$) |
|---|---|
| Titanium Dioxide | 453 |
| Quinacridone Red | 610 |
| Phthalocyanine Blue | 200 |

Figure 8:
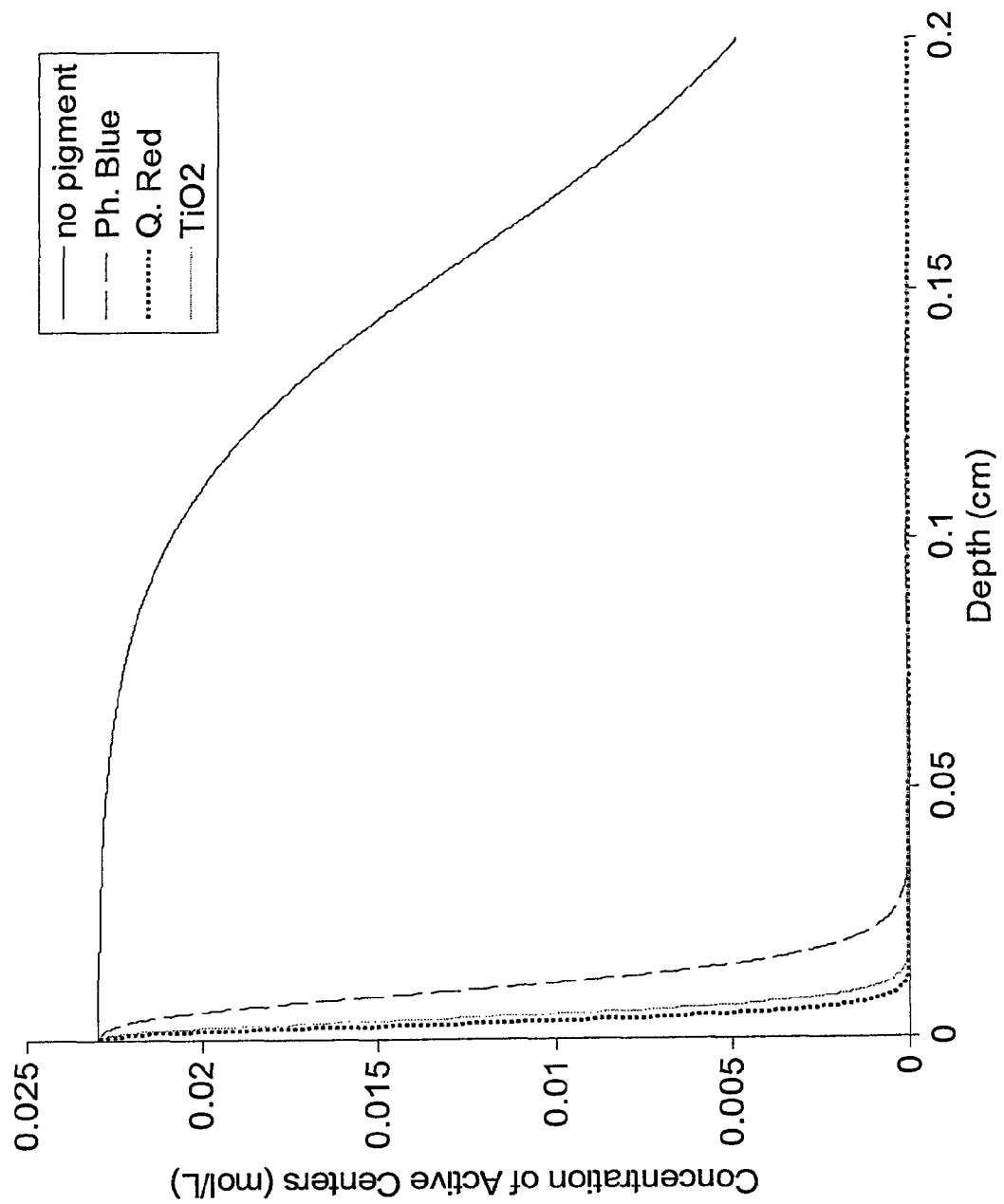
FIG. 8 shows active center profiles determined for three pigmented systems after 5 minutes illumination.

The MATLAB model was then used to determine the active center concentration profile for each pigment with 5 minutes of illumination. FIG. 8 compares the resulting active center profiles for the base case (without pigment) with the three pigmented systems. As the figure shows, active centers are generated up to ~100 μm in depth (0.01 cm) for TiO$_2$ and Quinacridone Red, and ~200 μm (0.02 cm) for Phthalocyanine Blue.

These model results are consistent with experimental data showing that, with the exception of Phthalocyanine Blue, 40-60 μm coatings containing 1 wt % of the pigments cured within the 5 minute illumination time.

The coatings containing 1 wt % Phthalocyanine Blue cured within 30 minutes. Without being bound by any particular theory, it is believed that cationic active centers are generated in the system. However, the Phthalocyanine Blue pigment exhibits an interactive affinity for the generated cationic centers which effectively prevents or slows the cationic center migration. Alkaline electron donors such as Hindered Amine Light Stabilizers (HALS) have been shown to prevent or prolong shadow cure in UV cationic polymerizable systems. The reactive cationic centers may react more preferentially with the alkaline electron donor than with the monomer, thus inhibiting polymerization.

Figure 9:
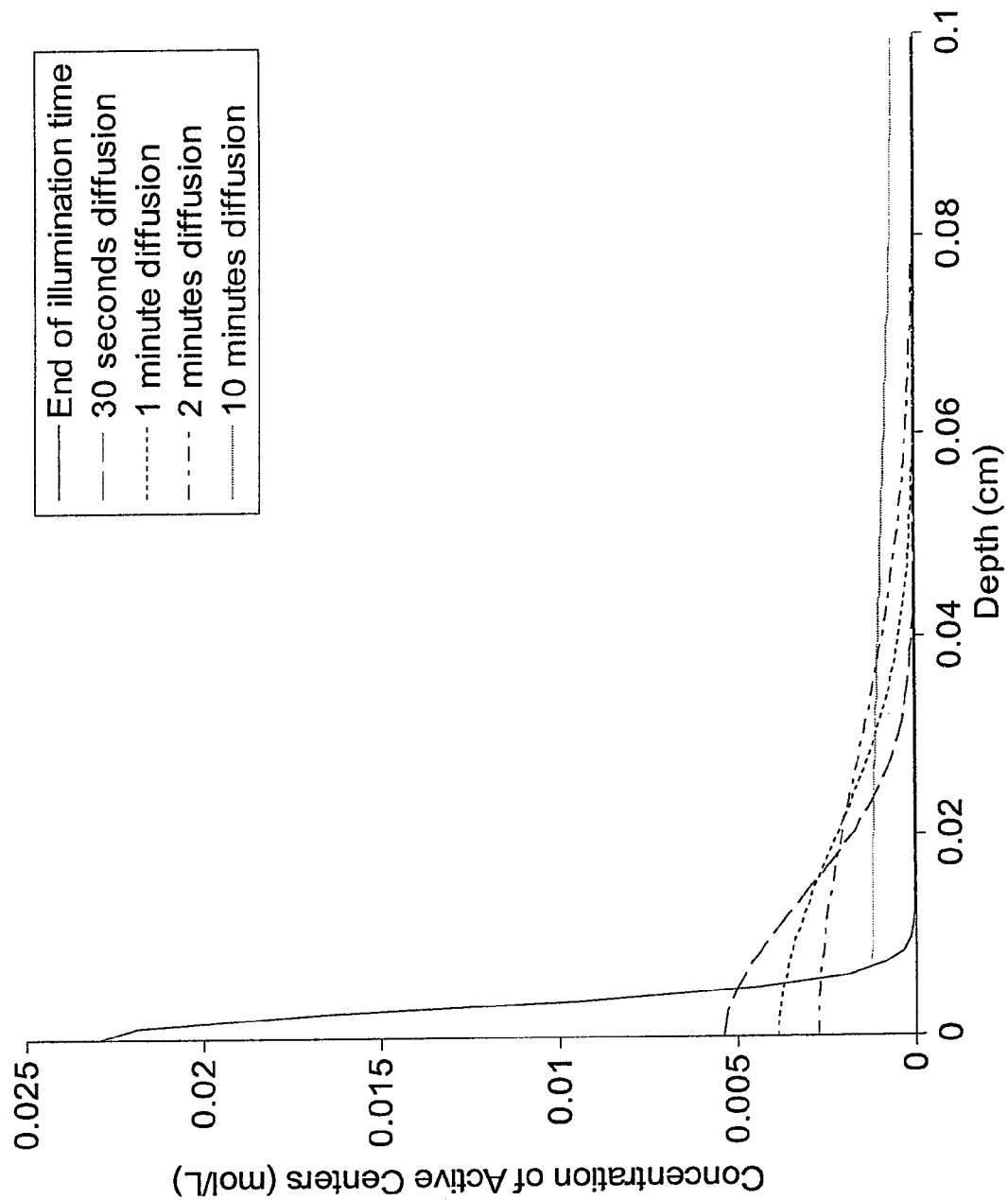
FIG. 9 shows determined active center spatial profiles during the first ten minutes of shadow cure for a system with 1% titanium dioxide.
Figure 10:
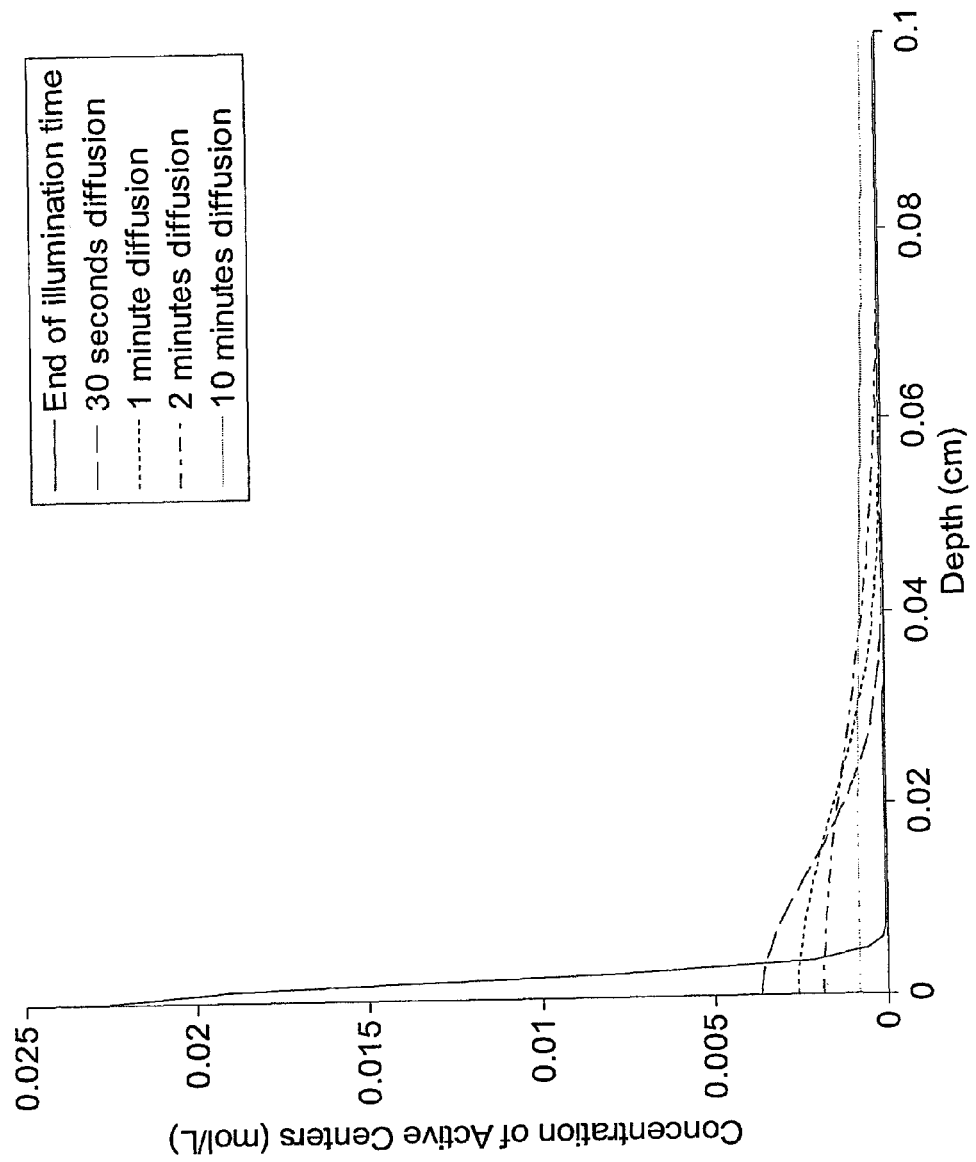
FIG. 10 shows determined active center spatial profiles during the first ten minutes of shadow cure for a system with 1% Quinacridone Red.
Figure 11:
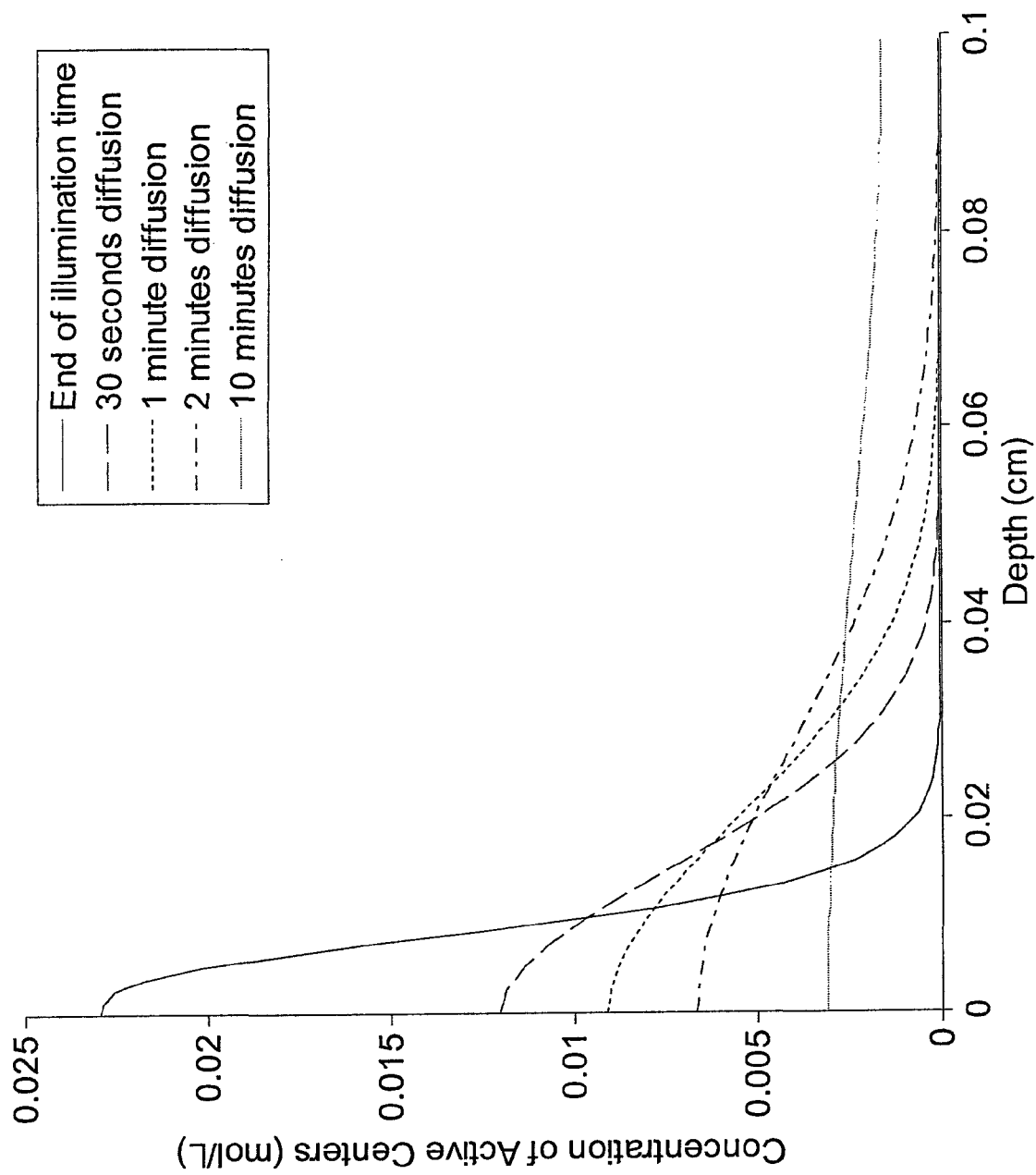
FIG. 11 shows determined active center spatial profiles during the first ten minutes of shadow cure for a system with 1% Phthalocyanine Blue.

In order to investigate the active center mobility in the pigmented systems, the Polychromatic Governing Set of Equations were solved using MATLAB software. The total active center concentration for each pigmented system at the end of the 5 minute illumination period (shown in FIG. 8) was used as initial condition for the shadow cure diffusion model. Because the light source is shuttered off after 5 minutes, no further active centers are produced. According to the numerical solutions, the concentration profile, which initially exhibited a steep gradient, broadened and diffused at least 1 mm into the sample after approximately 10 minutes post-illumination time. FIGS. 9 through 11 show the active center spatial profile during the 10 minute shadow cure period for TiO2, Quinacridone Red, and Phthalocyanine Blue.

Example 7

Use of the Method to Compare Systems and System Modification

The following three simulations were completed to investigate the effect of different monomer utilization in a coating and to show an expected effect of change in cationic center diffusion rate.

Figure 12:
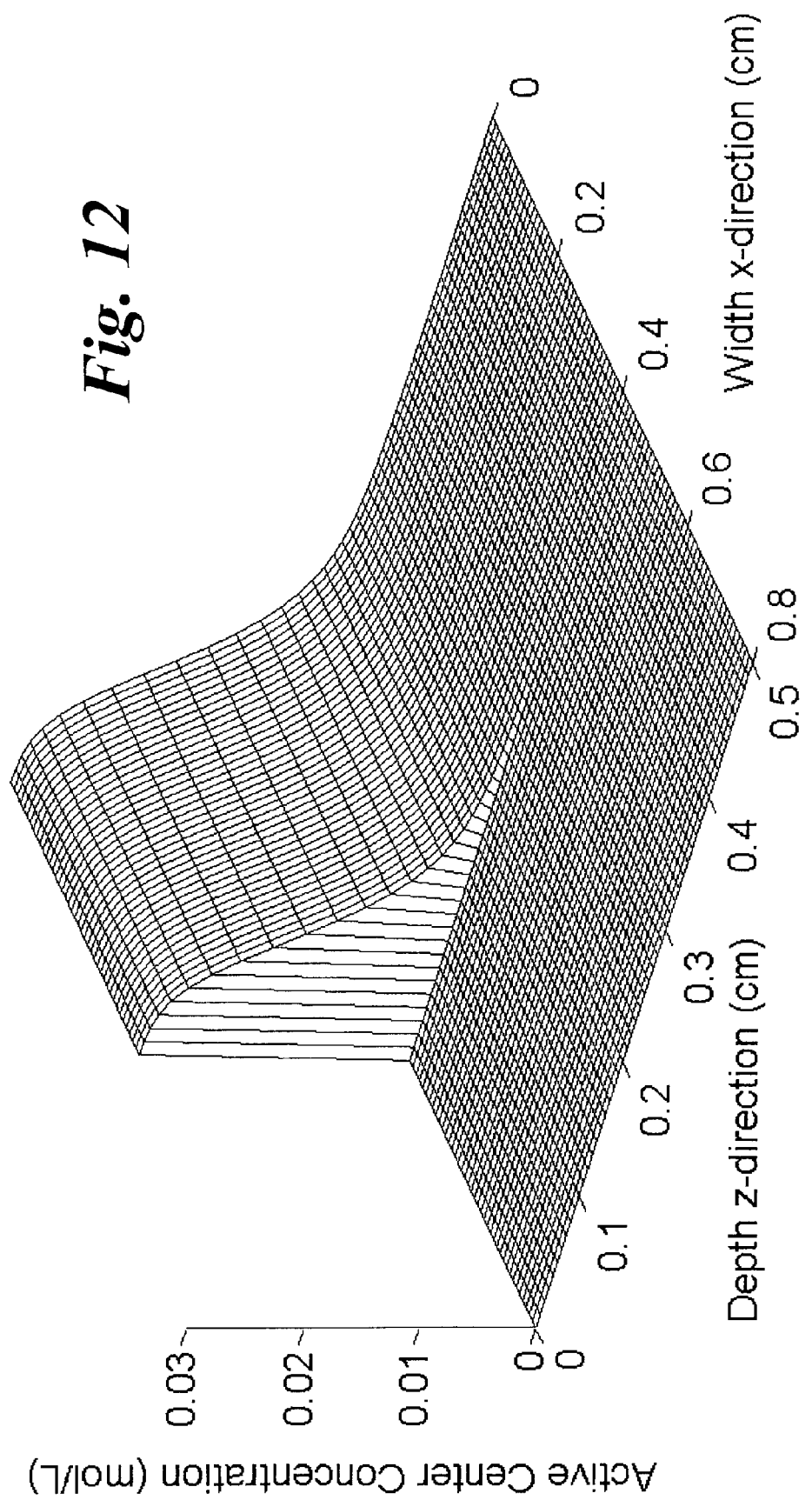
FIG. 12 shows the 2 dimensional cationic active center profile immediately following termination of illumination in the first experiment of Example 7.
Figure 13:
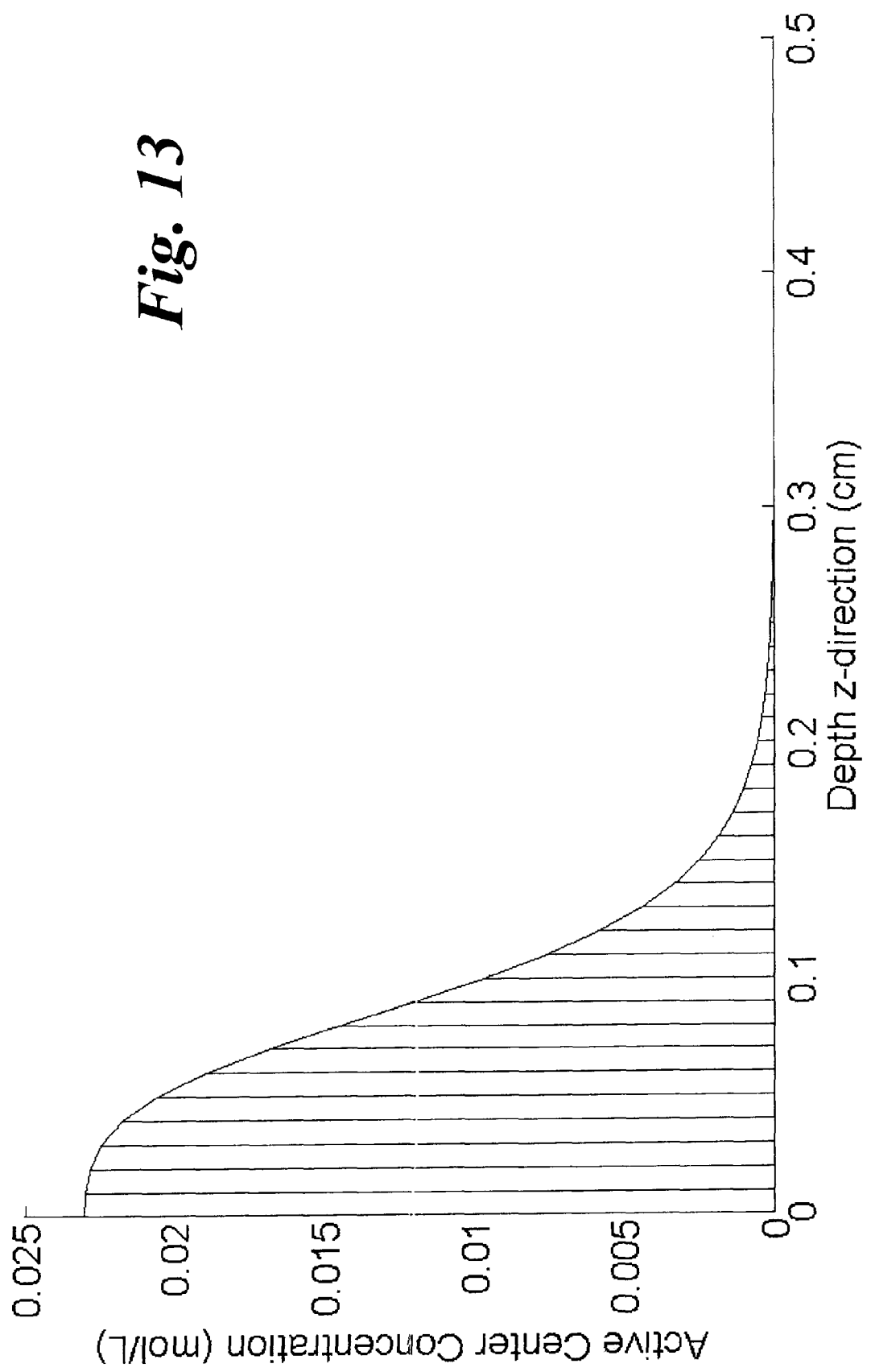
FIG. 13 shows the z dimensional profile corresponding to FIG. 12.
Figure 14:
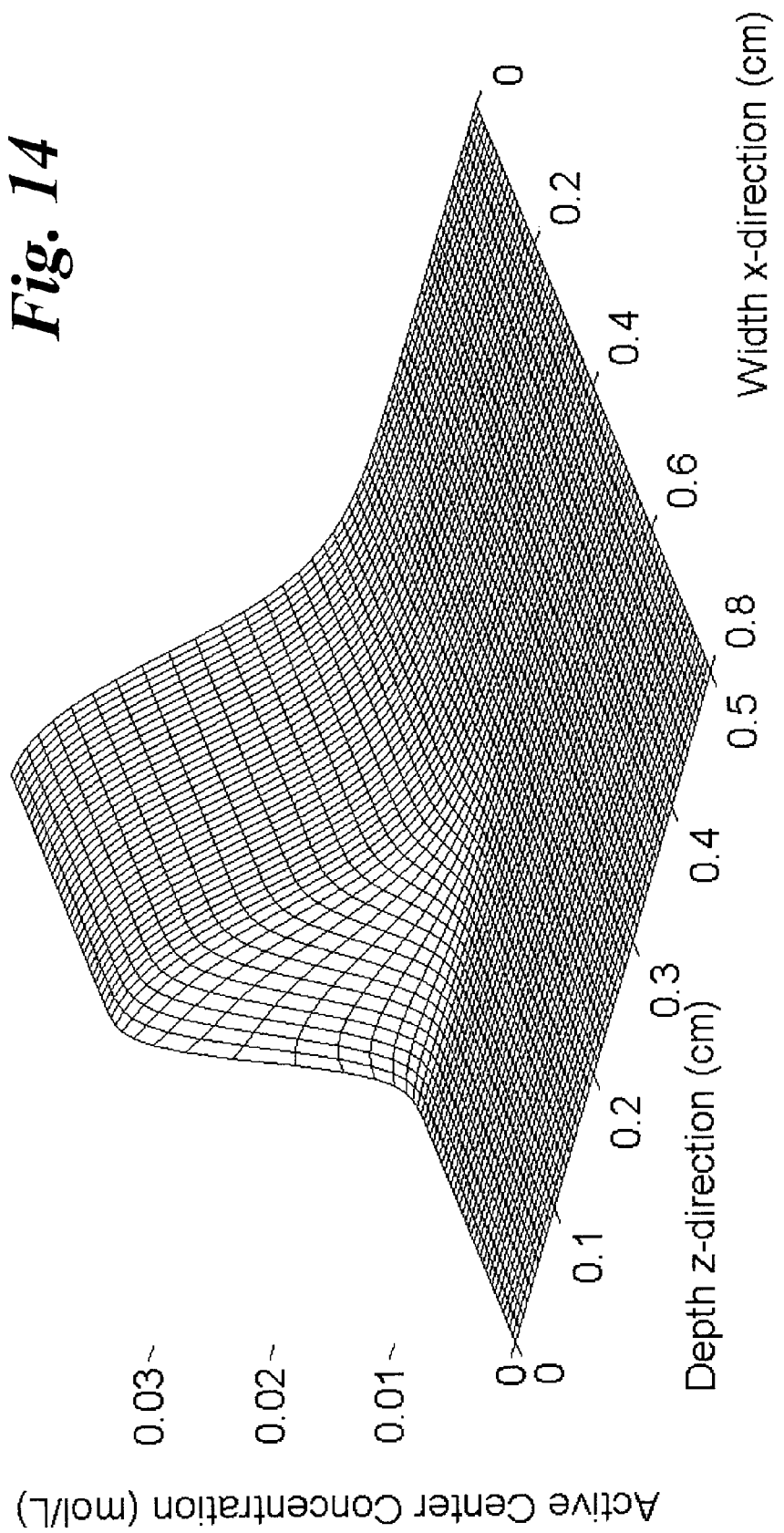
FIG. 14 shows the 2 dimensional cationic active center profile after 10 minutes shadow cure in the first experiment of Example 7.
Figure 15:
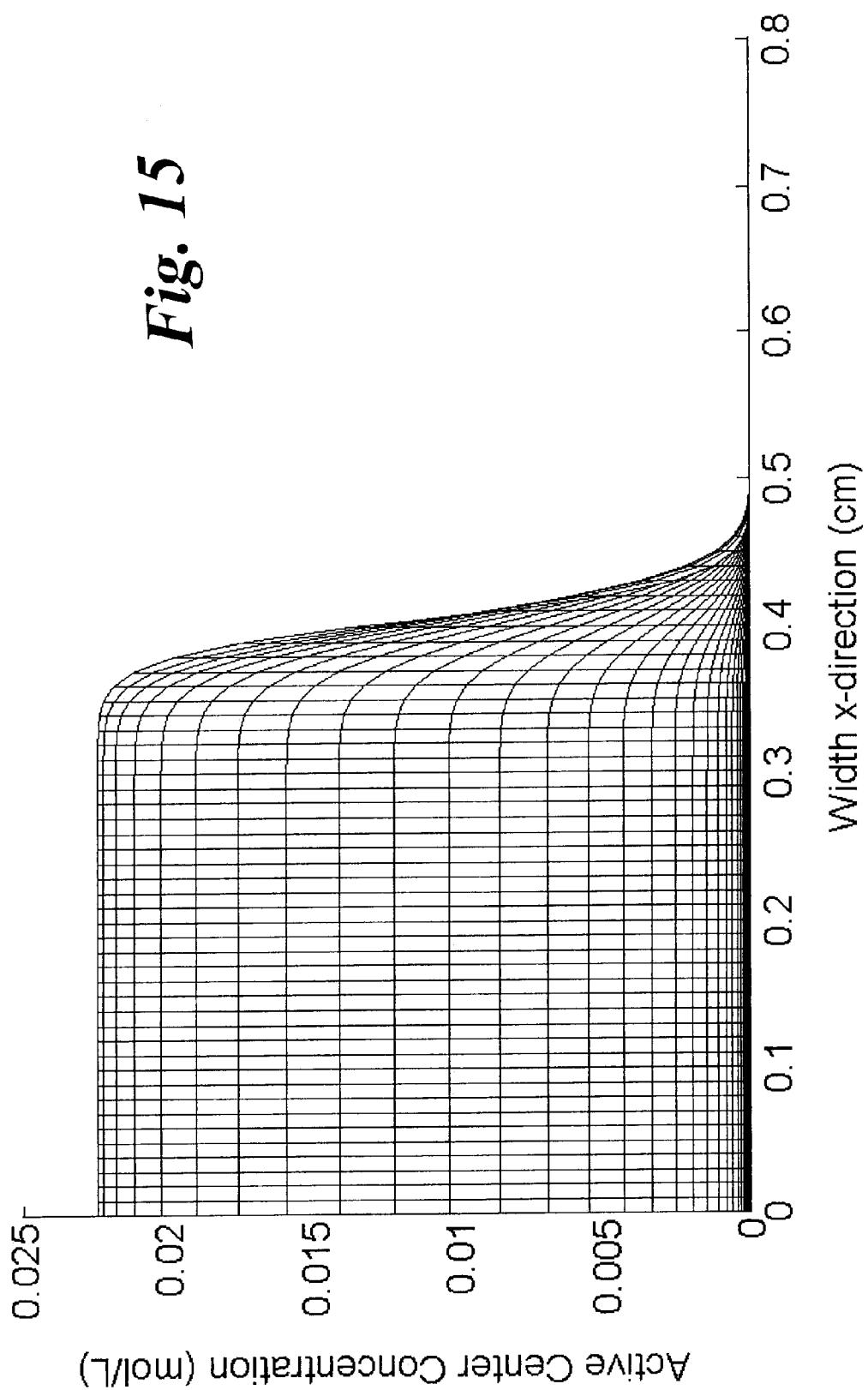
FIGS. 15 and 16 show the x and z dimensional profiles corresponding to FIG. 14.
Figure 16:
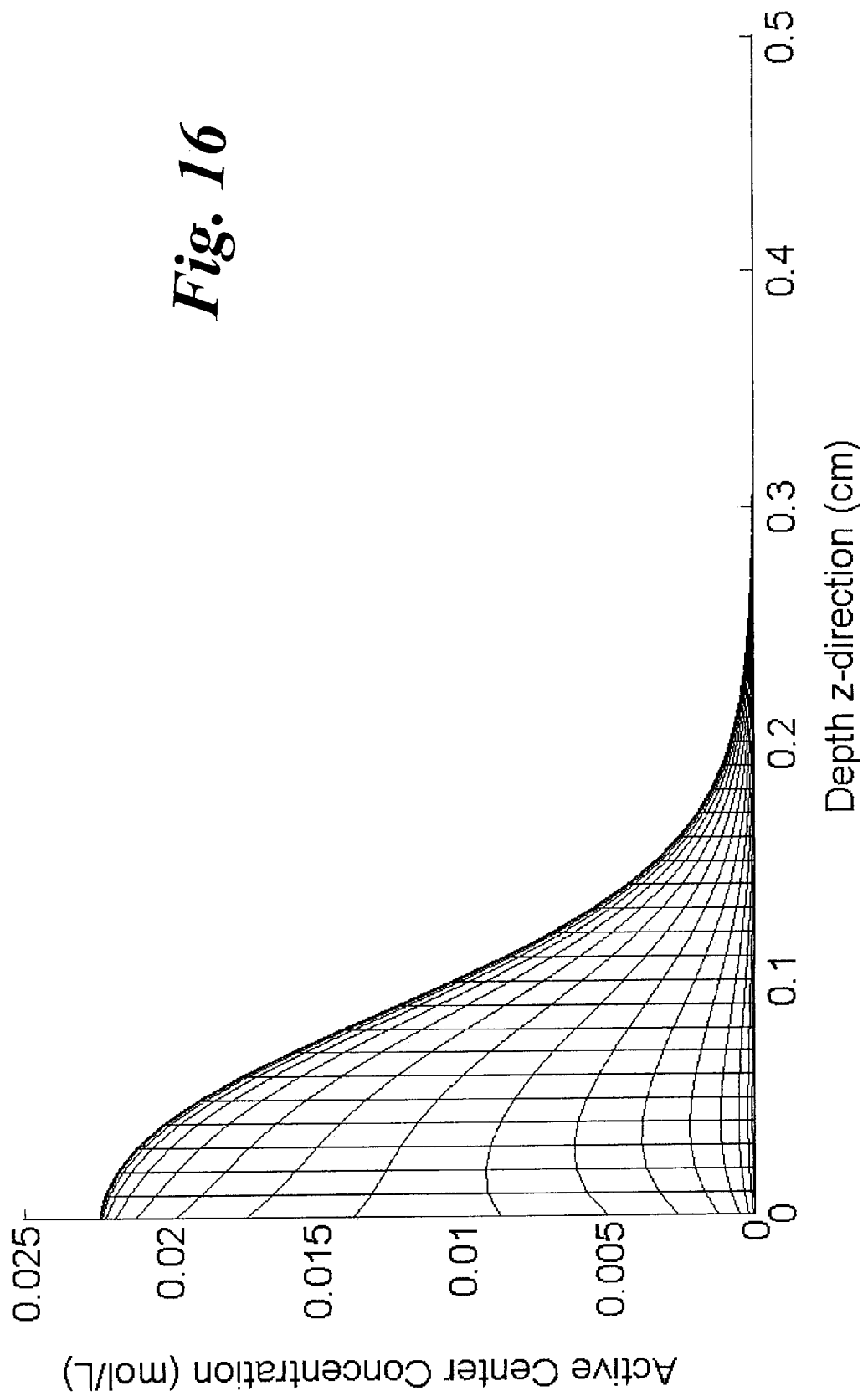

Simulation 1: In the first experiment, a cationic active profile was determined for a system containing 3,4-epoxy-cyclohexylmethanyl 3,4-epoxycyclohexane-carboxylate (CADE) as monomer and 0.02298 mol/l (tolylcumyl)iodonium tetrakis (pentafluorophenyl) borate (IPB) as initiator. The exposure time was 5 minutes at 25° C., while the shadow cure temperature was 50° C. An active center diffusion coefficient value of $3.14 \times 10^{-6}$ was used. The 2 dimensional cationic active center profile immediately following termination of illumination is shown in FIG. 12, while FIG. 13 shows a corresponding 1 dimensional profile (z). FIGS. 14, 15 and 16 show the 2 dimensional profile after 10 minutes shadow cure and corresponding x and z profiles, respectively.

Figure 17:
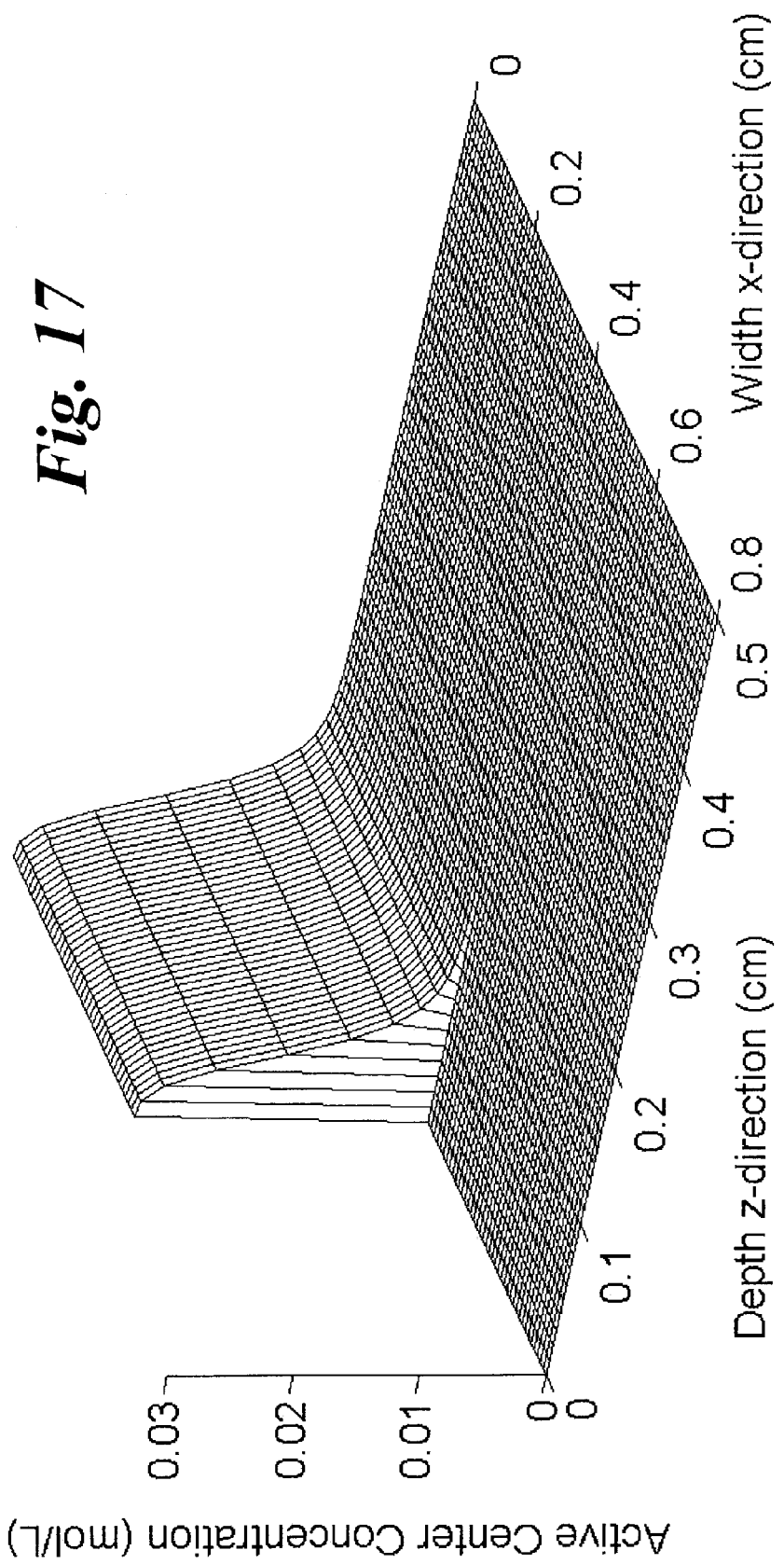
FIG. 17 shows the 2 dimensional cationic active center profile immediately following termination of illumination in the second experiment of Example 7.
Figure 18:
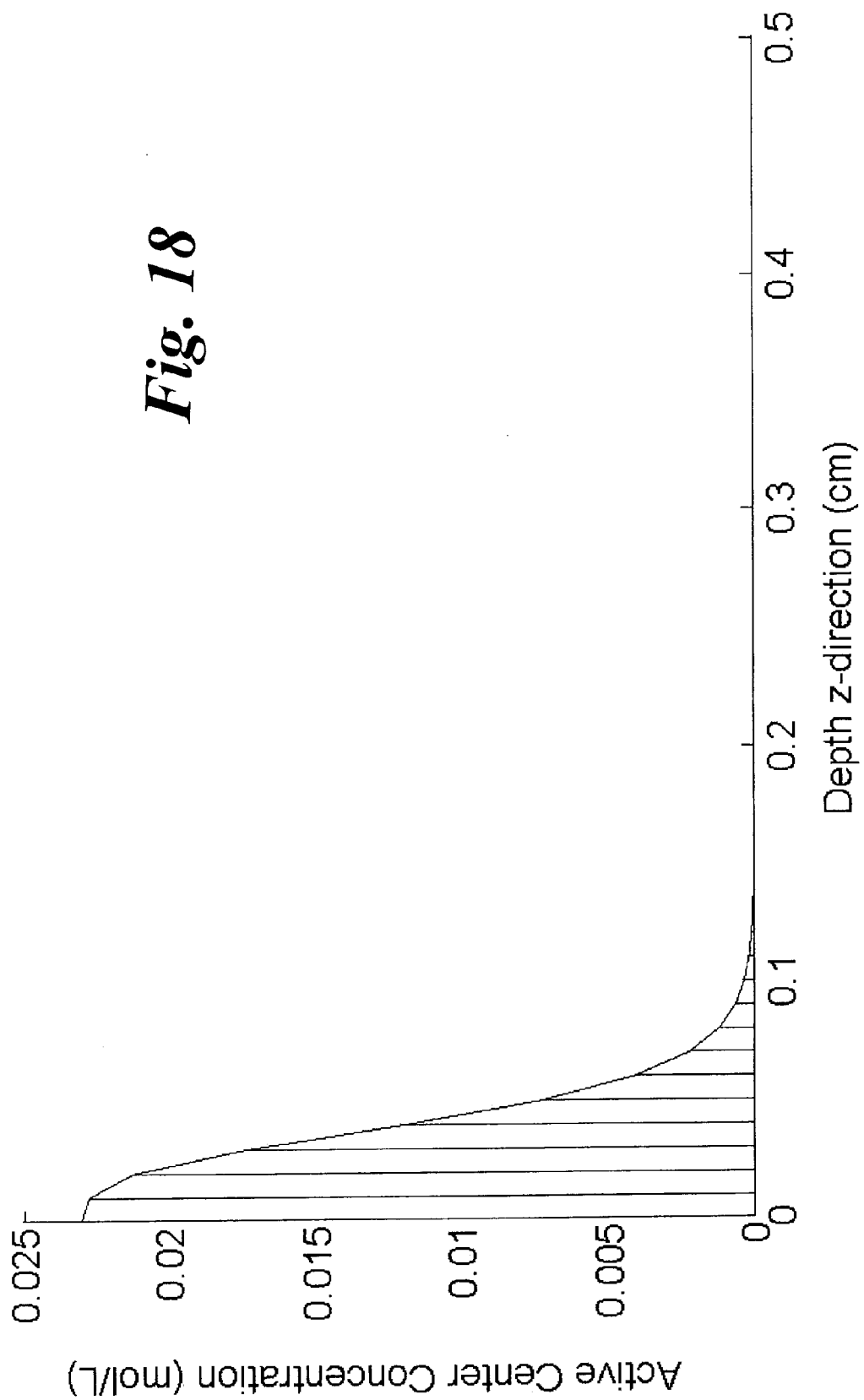
FIG. 18 shows the z dimensional profile corresponding to FIG. 17.
Figure 19:
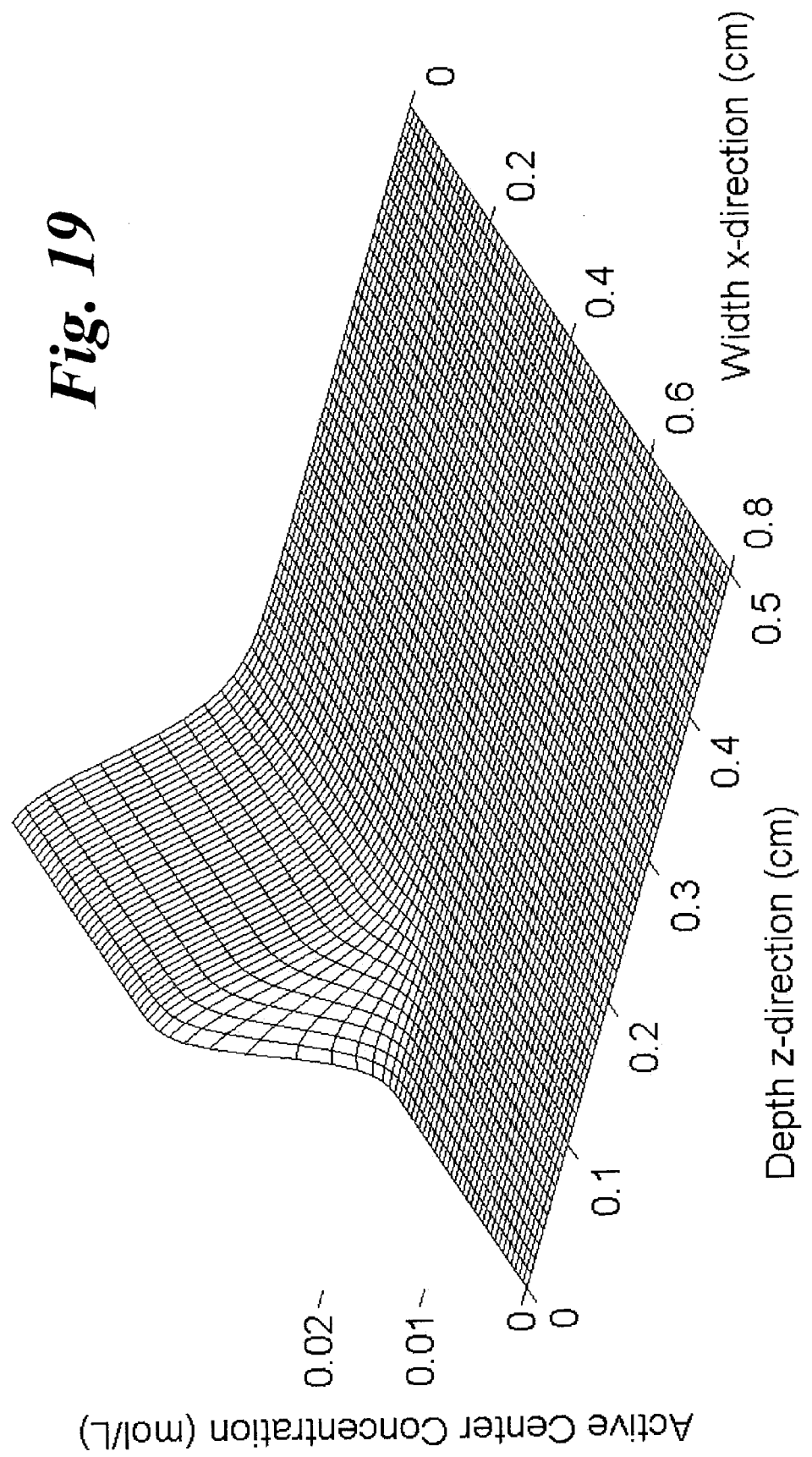
FIG. 19 shows the 2 dimensional cationic active center profile after 10 minutes shadow cure in the second experiment of Example 7.
Figure 20:
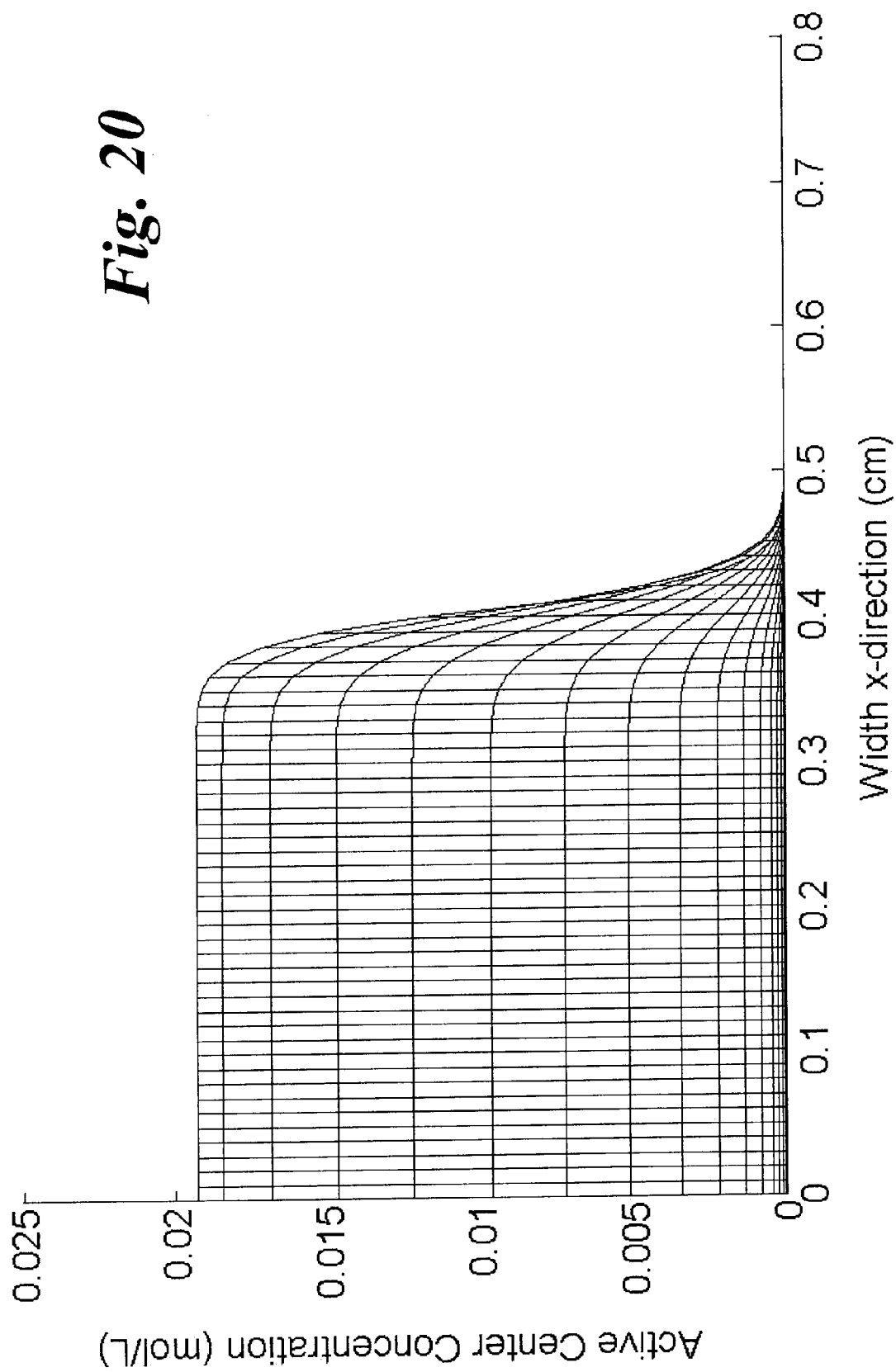
FIGS. 20 and 21 show the x and z dimensional profiles corresponding to FIG. 19.
Figure 21:
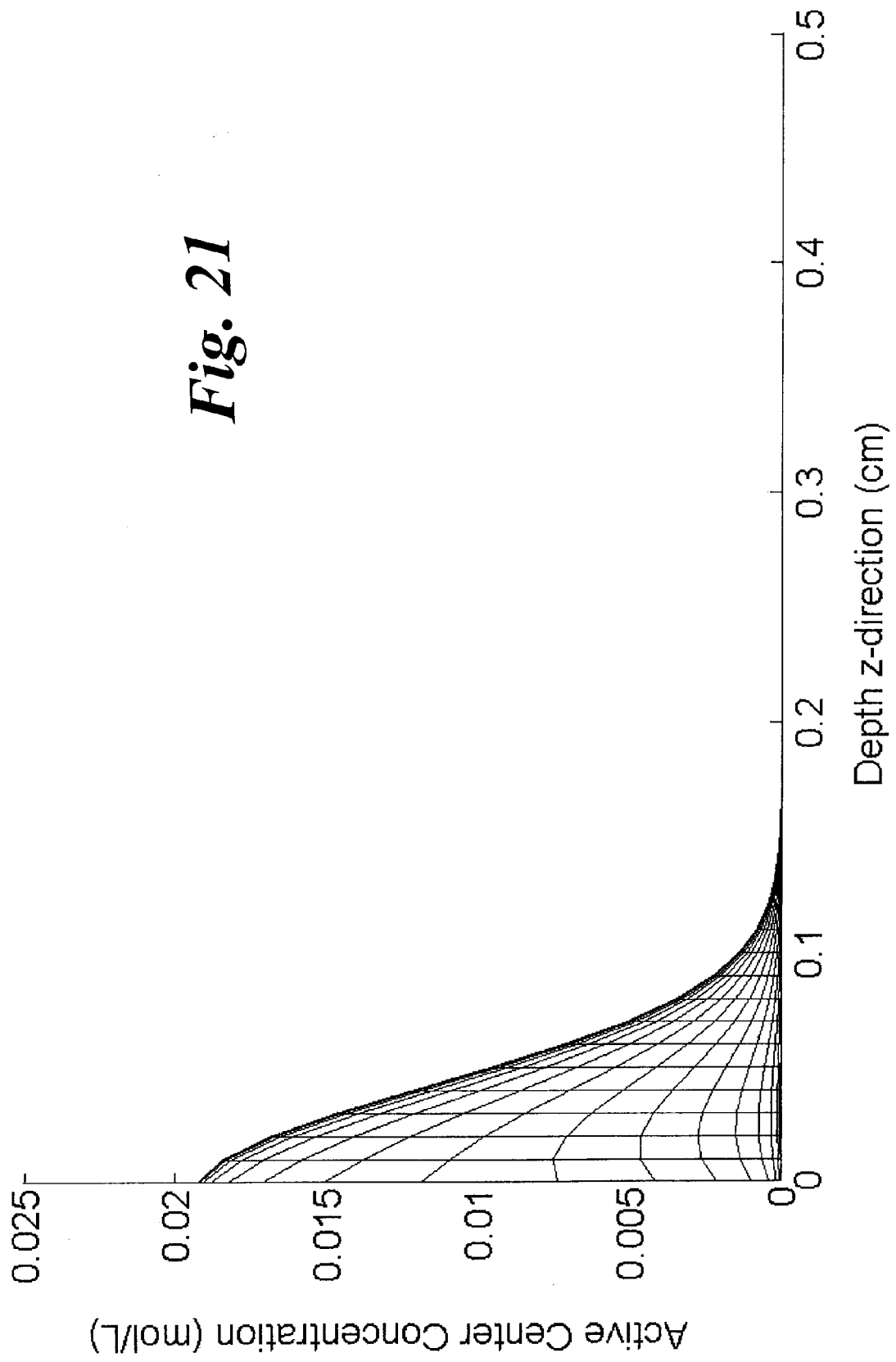

Simulation 2: In the second experiment, a system wherein the CADE was replaced by an epoxidized linseed oil, (Vikoflex 7190® from Arkema™), while all other variables were equivalent, was employed. The 2 dimensional cationic active center profile immediately following termination of illumination is shown in FIG. 17 and the corresponding z dimensional profile in FIG. 18. The 2 dimensional profile after 10 minutes shadow cure is shown in FIG. 19, while FIGS. 20 and 21 show the corresponding x and z profiles, respectively.

Figure 22:
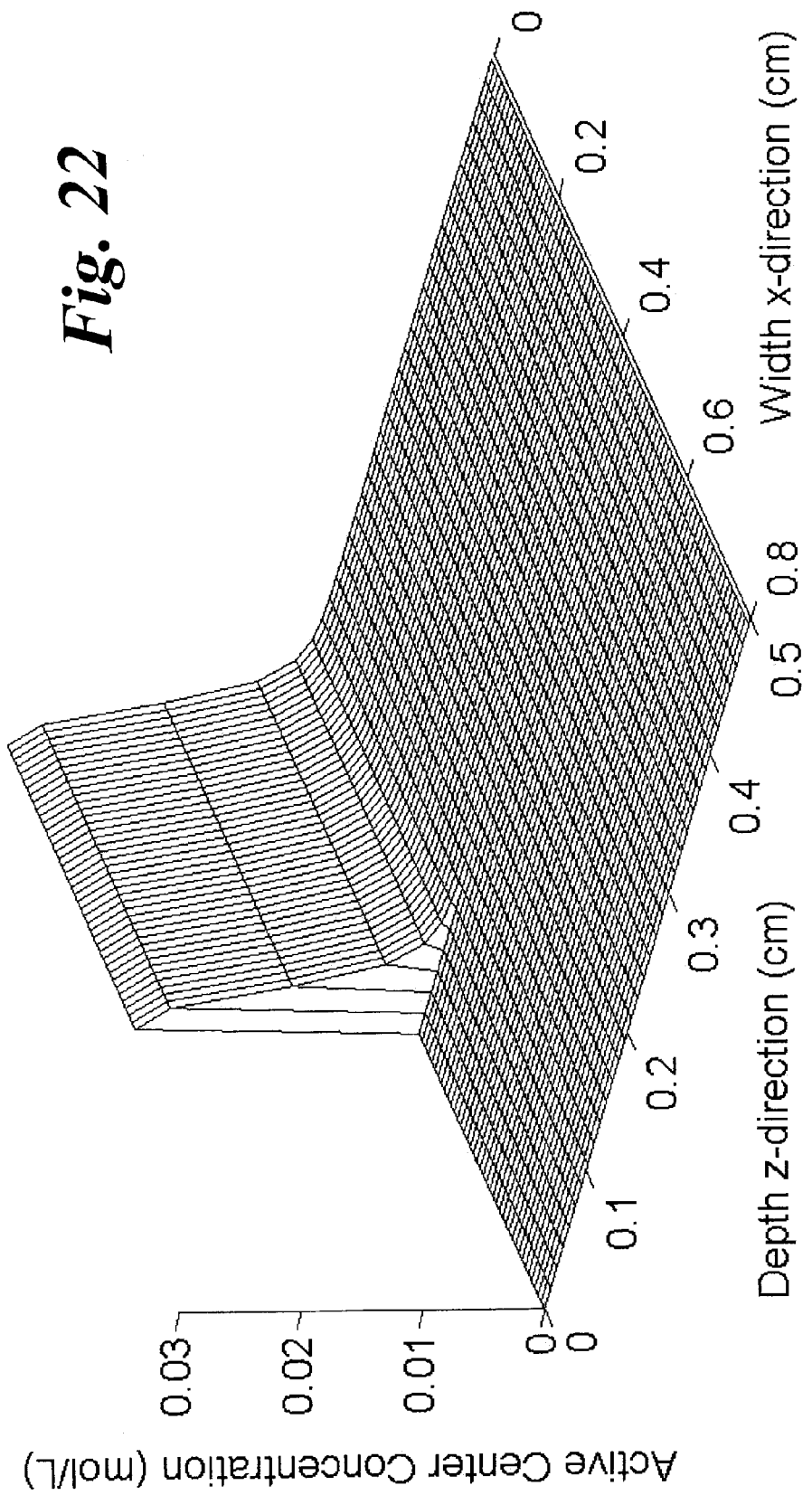
FIG. 22 shows the 2 dimensional cationic active center profile immediately following termination of illumination in the third experiment of Example 7.
Figure 23:
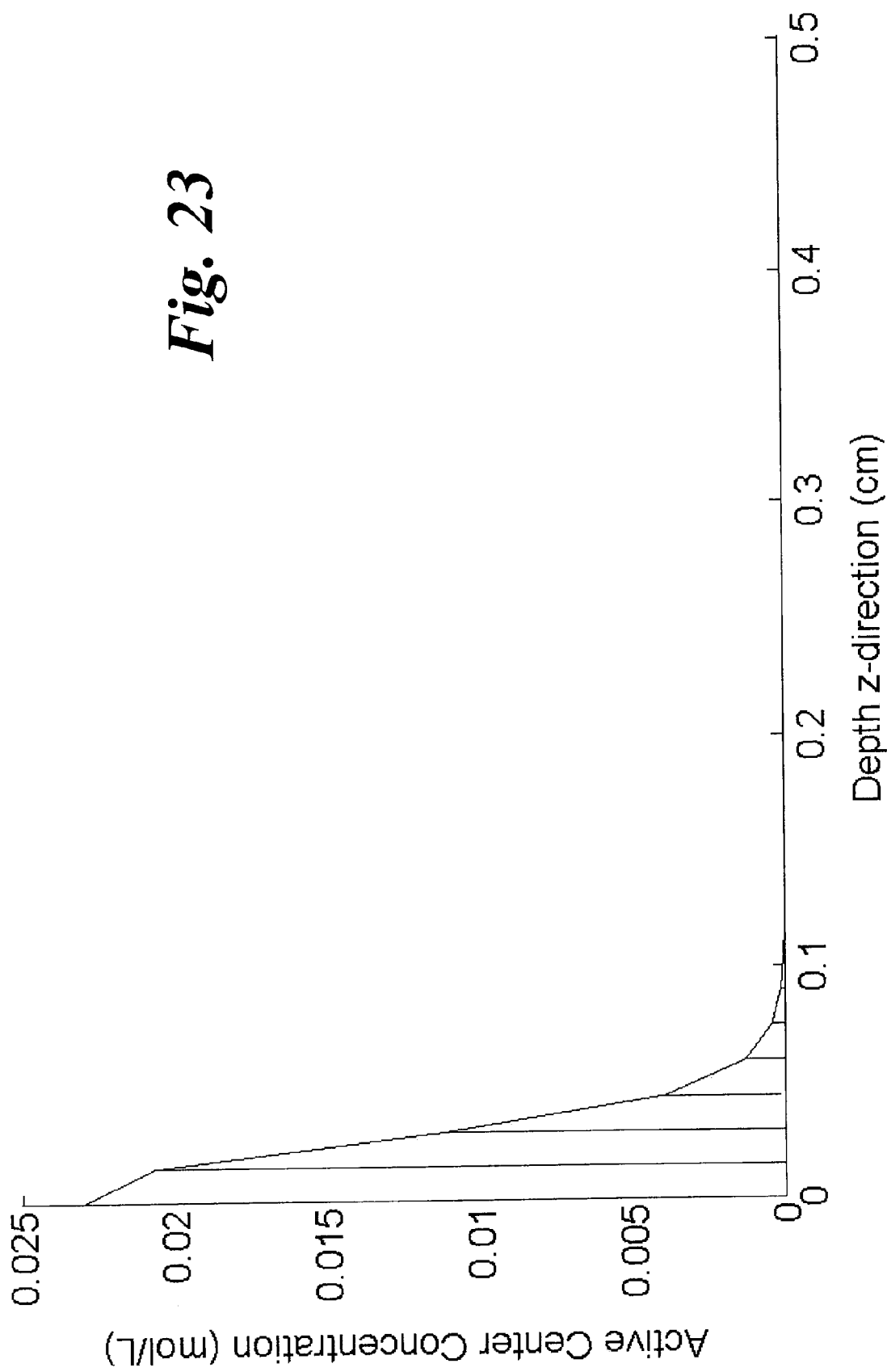
FIG. 23 shows the z dimensional profile corresponding to FIG. 22.
Figure 24:
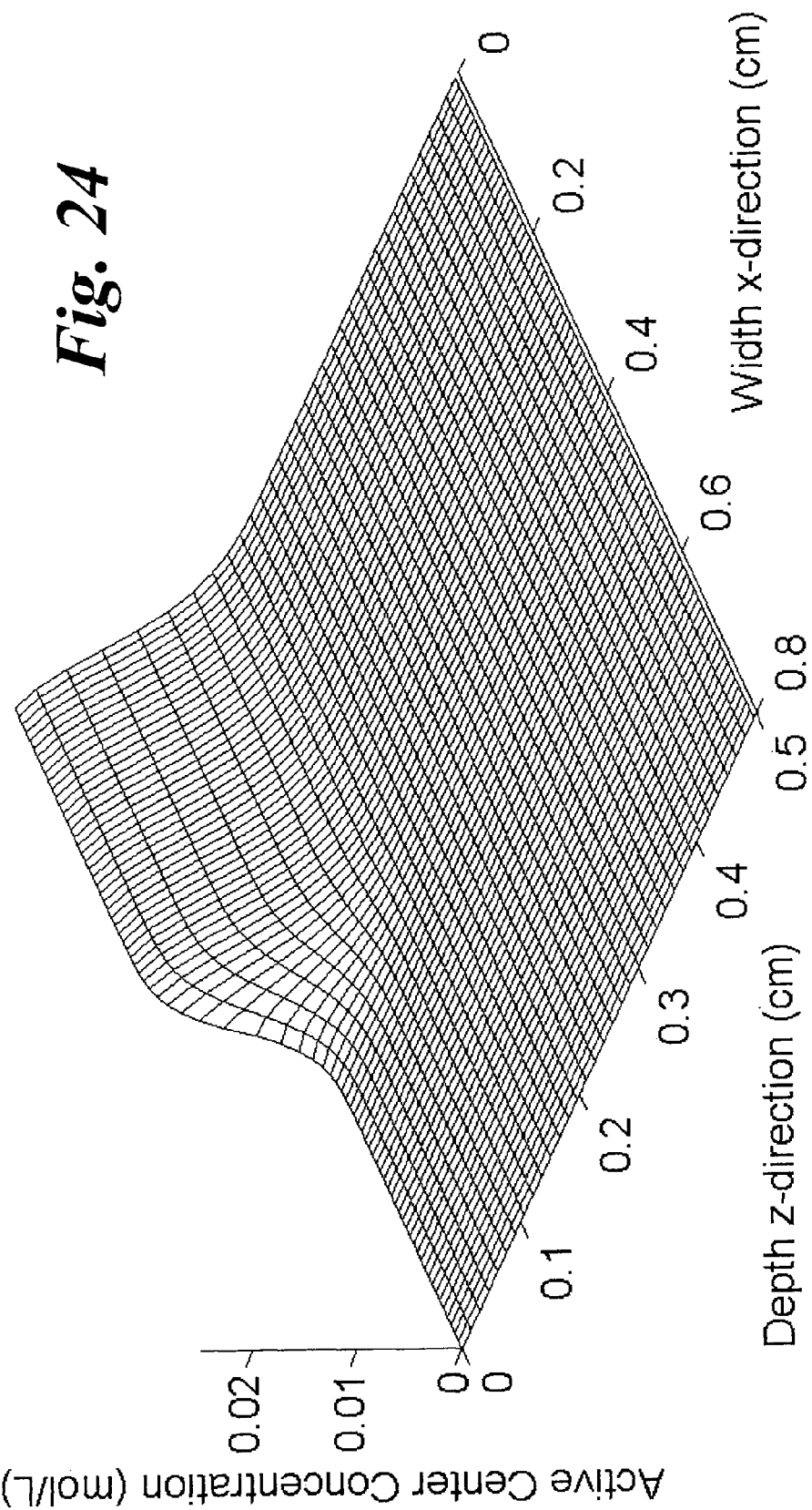
FIG. 24 shows the 2 dimensional cationic active center profile after 10 minutes shadow cure in the third experiment of Example 7.
Figure 25:
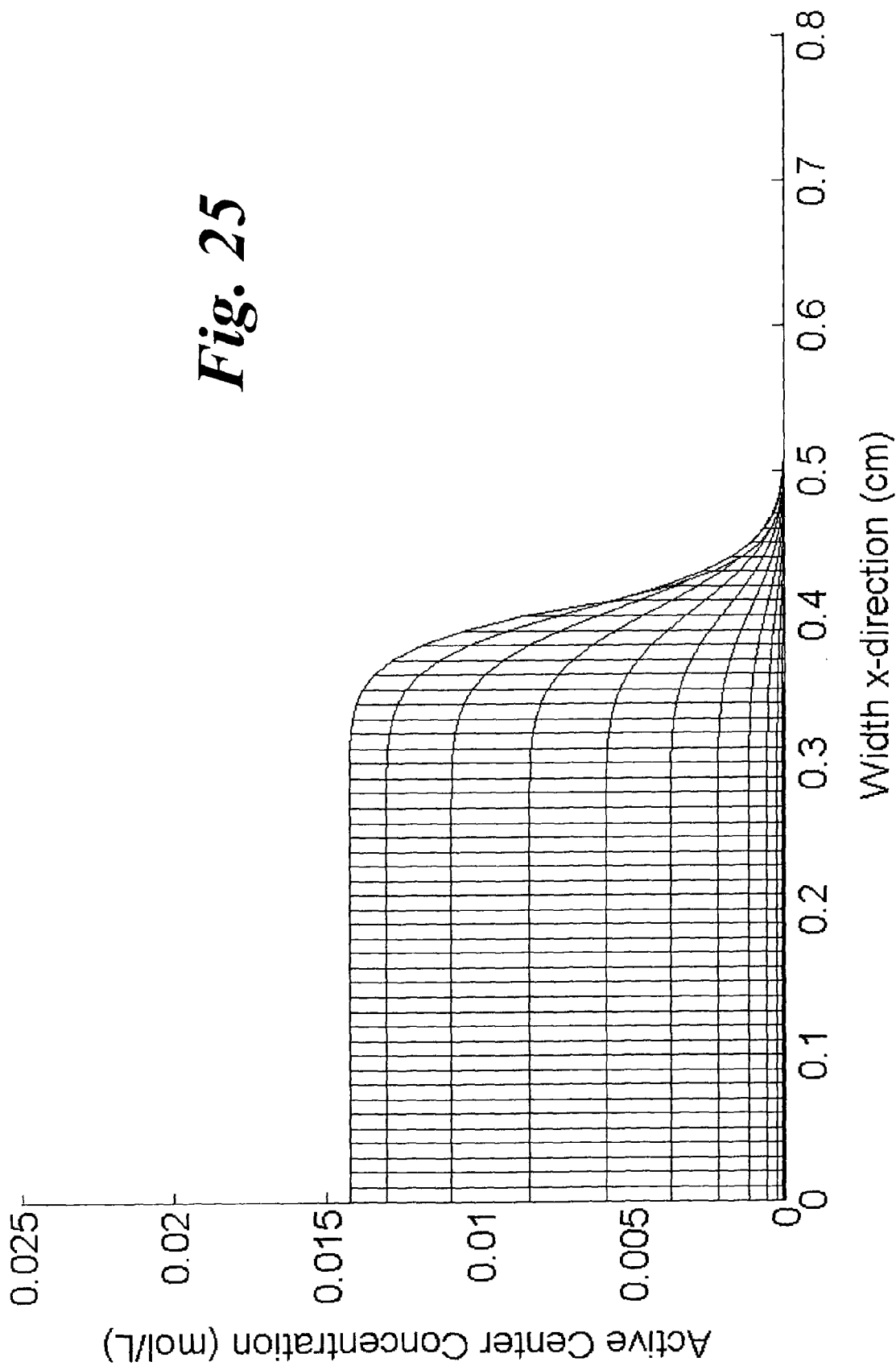
FIGS. 25 and 26 show the x and z dimensional profiles corresponding to FIG. 24.
Figure 26:
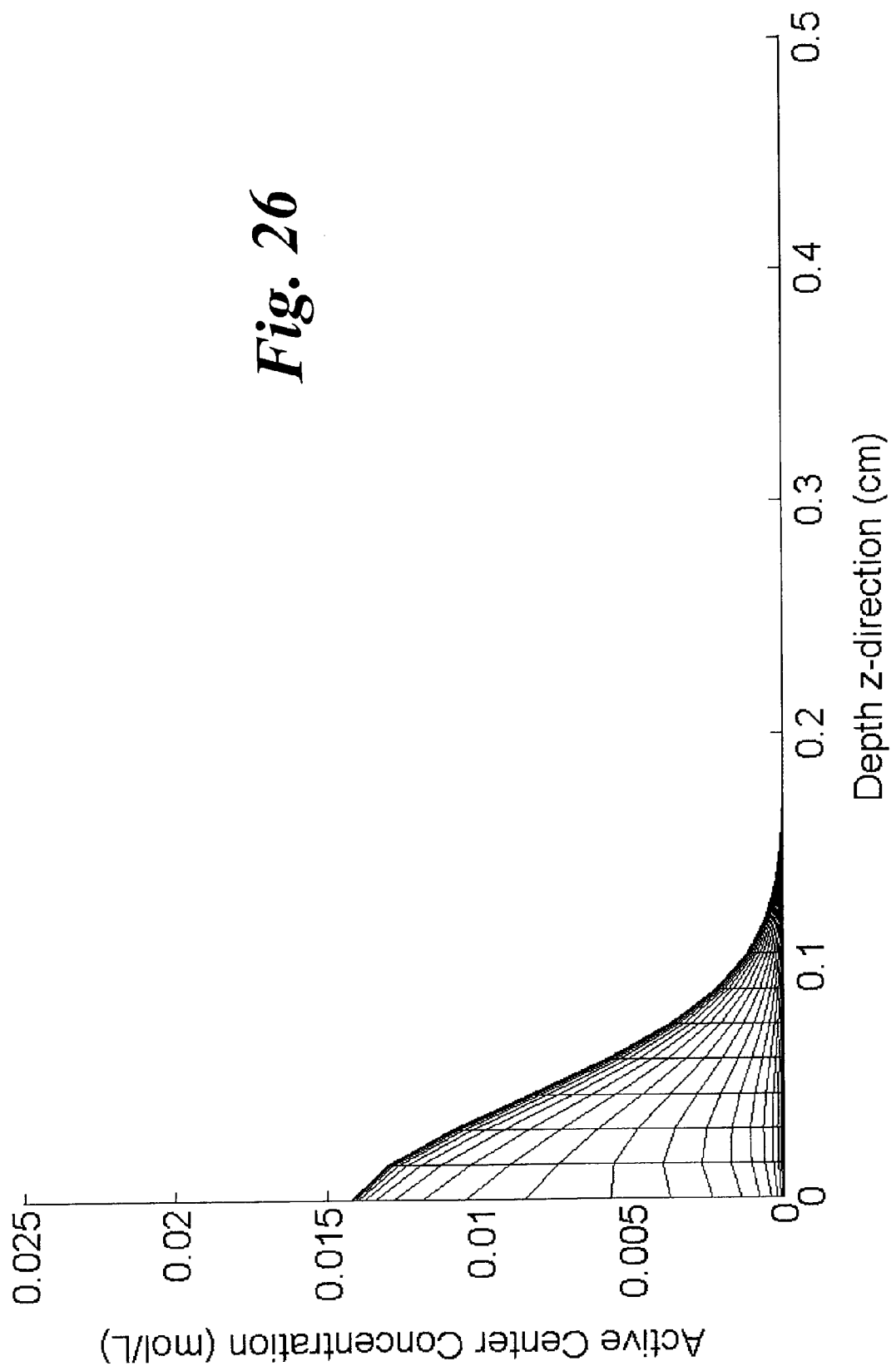

Simulation 3: In the third experiment, the same system as employed for Experiment 2 was employed, with the exception that an active center diffusion coefficient value of $6 \times 10^{-6}$ was used. Although this value was not experimentally determined, it was selected to evaluate demonstrate the effect of a twofold increase in the value of the diffusion coefficient on shadow cure. The 2 dimensional cationic active center profile immediately following termination of illumination is shown in FIG. 22 and the corresponding z dimensional profile in FIG. 23. The 2 dimensional profile after 10 minutes shadow cure is shown in FIG. 24, while FIGS. 25 and 26 show the corresponding x and z profiles.

From the graphs in FIGS. 12 through 26, it can be seen that the epoxidized linseed oil has a higher absorption in the UV region of interest (295-308 nm) than the CADE because cationic active centers were generated farther into the depth of the sample at termination of illumination (Shadow cure time=0 sec.) for the system of the first experiment. A comparison of Experiments 2 and 3 shows the importance of the diffusion coefficient for a system. As indicated in the profiles for Experiments 2 and 3, the cationic active centers migrated farther into the width of the unilluminated region in Experiment 3 (Shadow cure time=10 min.)

The invention claimed is:

1. A method for evaluating a UV polymerizable cationic system for coating performance on a substrate, comprising:
   a) selecting a UV polymerizable cationic system to investigate for coating performance;
   b) identifying or selecting core and mesh variables for the selected UV polymerizable cationic coating system;
   c) estimating a coating cure for the selected UV polymerizable cationic coating system in spatial dimensions of depth and width by numerical solution of a Polychromatic Governing Set of Equations based on the identified core and mesh variables; and
   d) evaluating the selected coating system based on the obtained estimated cure depth and width;
   wherein
   the Polychromatic Governing Set of Equations calculates a concentration of cationic active centers produced during a UV illumination period and in addition,
   a diffusion of the cationic active centers in the two spatial dimensions during a specified period of time following termination of the illumination is calculated according to equation (5):

$$\partial C_{ac}(t,x,z)/\partial t = D_{ac}[\partial^2 C_{ac}(t,x,z)/\partial x^2 + \partial^2 C_{ac}(t,x,z)/\partial z^2] \quad (5)$$

wherein
   $C_{ac}(t,x,z)$ is the active center molar concentration at time t, depth z and width x, the value of $C_{ac}$ at termination of illumination is of a magnitude of $10^{-3}$ to $10^{-2}$ mol/L, and
   $D_{ac}$ is the diffusion coefficient of the active center post illumination in units of length$^2$/time.

2. The method for evaluating a UV polymerizable cationic system for coating performance on a substrate according to claim 1, further comprising:
   e) after evaluating the selected coating system based on the obtained estimated cure depth and width, selecting one or more different core variables;
   f) estimating a coating cure for the selected UV polymerizable cationic coating system in spatial dimensions of depth and width by solution of the Polychromatic Governing Set of Equations based on the selected one or more different core and mesh variables; and
   g) further evaluating the obtained estimated cure depth and width with respect to curing requirements; and
   h) repeating e), f) and g) until the estimated coating cure meets the curing requirements.

3. The method for evaluating a UV polymerizable cationic system for coating performance on a substrate according to claim 1, wherein the core variables are variables which define the selected UV polymerizable cationic coating system and further comprise:

an initial concentration of a photoinitiator;
an optical yield value for the photoinitiator;
a total energy intensity of an irradiation source which provides the UV illumination;
a wavelength range of irradiation of the UV illumination;
a UV illumination width;
a shadow width;
a total UV illumination time;
a shadow cure time; and
a coating sample depth.

4. The method for evaluating a UV polymerizable cationic system for coating performance on a substrate according to claim 3, wherein the mesh variables are values provided to solve the Polychromatic Governing Set of Equations and comprise:
a depth increment;
a UV illumination time increment;
a shadow cure increment; and
a width increment.

5. The method for evaluating a UV polymerizable cationic system for coating performance on a substrate according to claim 3, wherein the coating system comprises:
at least one photoinitiator;
at least one UV cationic polymerizable monomer; and
one or more optional additives.

6. The method for evaluating a UV polymerizable cationic system for coating performance on a substrate according to claim 5, wherein the at least one photoinitiator is at least one selected from the group consisting of a diazonium salt, a diaryliodonium salt, a triarylsulphonium salt, a dialkylphenacylsulfonium salt, a ferrocenium salt, an α-sulphonyloxy ketone and a silyl benzyl ether.

7. The method for evaluating a UV polymerizable cationic system for coating performance on a substrate according to claim 5, wherein the at least one UV cationic polymerizable monomer is selected from the group consisting of a monofunctional or difunctional epoxides, a high molecular weight epoxy oligomer, an epoxy resin, an epoxidized seed oil, a cyclic sulphide, a vinyl ether, a cyclic ether, a cyclic formal, a cyclic acetal, a cyclic lactone and a cyclic siloxane.

8. The method for evaluating a UV polymerizable cationic system for coating performance on a substrate according to claim 5, wherein the at least one UV cationic polymerizable monomer is selected from the group consisting of a cycloaliphatic diepoxide and a glycidyl ether.

9. A method for optimizing production parameters for a UV polymerizable cationic coating system on a substrate having specific curing requirements, comprising:
a) identifying or selecting core and mesh variables for the UV polymerizable cationic coating system;
b) estimating a coating cure for the selected UV polymerizable cationic coating system in spatial dimensions of depth and width by numerical solution of a Polychromatic Governing Set of Equations based on the identified core and mesh variables; and
c) evaluating the obtained estimated cure depth and width with respect to the substrate curing requirements;
wherein
the Polychromatic Governing Set of Equations calculates a concentration of cationic active centers produced during a UV illumination period and
determines a diffusion of the cationic active centers in the two spatial dimensions during a specified period of time following termination of the illumination according to equation (5):

$$\partial C_{ac}(t,x,z)/\partial t = D_{ac}[\partial^2 C_{ac}(t,x,z)/\partial x^2 + \partial^2 C_{ac}(t,x,z)/\partial z^2] \quad (5)$$

wherein $C_{ac}(t,x,z)$ is the active center molar concentration at time t, depth z and width x, and $D_{ac}$ is the diffusion coefficient of the active center in units of length$^2$/time.

10. The method for optimizing production parameters for a UV polymerizable cationic coating system on a substrate having specific curing requirements according to claim 9, further comprising:
d) after evaluating the obtained estimated cure depth and width with respect to the substrate curing requirements, selecting one or more different core variables;
e) estimating a coating cure for the selected UV polymerizable cationic coating system in spatial dimensions of depth and width by solution of a Polychromatic Governing Set of Equations based on the selected one or more different core and mesh variables; and
f) further evaluating the obtained estimated cure depth and width with respect to the substrate curing requirements; and
g) repeating d), e) and f) until the estimated coating cure meets the substrate curing requirements.

11. The method for optimizing production parameters for a UV polymerizable cationic coating system on a substrate having specific curing requirements according to claim 9, wherein the core variables are variables which define the UV polymerizable cationic coating system and further comprise:
an initial concentration of a photoinitiator;
an optical yield value for the photoinitiator;
a total energy intensity of an irradiation source which provides the UV illumination;
a wavelength range of irradiation of the UV illumination;
a UV illumination width;
a shadow width;
a total UV illumination time;
a shadow cure time; and
a coating sample depth.

12. The method for optimizing production parameters for a UV polymerizable cationic coating system on a substrate having specific curing requirements according to claim 11, wherein the mesh variables are values provided to solve the Polychromatic Governing Set of Equations and comprise:
a depth increment;
a UV illumination time increment;
a shadow cure increment; and
a width increment.

13. The method for optimizing production parameters for a UV polymerizable cationic coating system on a substrate having specific curing requirements, according to claim 9, wherein the substrate having specific curing requirements is a body or body part of an automobile, truck or sport utility vehicle.

14. The method for optimizing production parameters for a UV polymerizable cationic coating system on a substrate having specific curing requirements, according to claim 9, wherein the coating system comprises:
at least one photoinitiator;
at least one UV cationic polymerizable monomer; and
one or more optional additives.

15. The method for optimizing production parameters for a UV polymerizable cationic coating system on a substrate having specific curing requirements, according to claim 14, wherein the at least one photoinitiator is at least one selected from the group consisting of a diazonium salt, a diaryliodonium salt, a triarylsulphonium salt, a dialkylphenacylsulfonium salt, a ferrocenium salt, an α-sulphonyloxy ketone and a silyl benzyl ether.

16. The method for optimizing production parameters for a UV polymerizable cationic coating system on a substrate having specific curing requirements, according to claim 14, wherein the at least one UV cationic polymerizable monomer is selected from the group consisting of a monofunctional or difunctional epoxides, a high molecular weight epoxy oligomer, an epoxy resin, an epoxidized seed oil, a cyclic sulphide, a vinyl ether, a cyclic ether, a cyclic formal, a cyclic acetal, a cyclic lactone and a cyclic siloxane.

17. The method for optimizing production parameters for a UV polymerizable cationic coating system on a substrate having specific curing requirements, according to claim 14, wherein the at least one UV cationic polymerizable monomer is selected from the group consisting of a cycloaliphatic diepoxide and a glycidyl ether.

18. The method for optimizing production parameters for a UV polymerizable cationic coating system on a substrate having specific curing requirements, according to claim 17, wherein the at least one UV cationic polymerizable monomer is a cycloaliphatic diepoxide and the cycloaliphatic diepoxide is 3,4-epoxy-cyclohexylmethanyl 3,4-epoxycyclohexane-carboxylate.

19. The method for optimizing production parameters for a UV polymerizable cationic coating system on a substrate having specific curing requirements, according to claim 14, wherein the one or more optional additive is at least one selected from the group of additives consisting of a hindered amine light stabilizer, a UV absorber and a pigment.

20. The method for optimizing production parameters for a UV polymerizable cationic coating system on a substrate having specific curing requirements, according to claim 17, wherein the at least one UV cationic polymerizable monomer is a glycidyl ether and the glycidyl ether is 2-butoxymethyl-oxirane.

* * * * *